United States Patent
Hashimoto et al.

(10) Patent No.: US 6,576,566 B2
(45) Date of Patent: Jun. 10, 2003

(54) APPARATUS AND METHOD FOR FORMING THIN FILM AT LOW TEMPERATURE AND HIGH DEPOSITION RATE

(75) Inventors: Kazuhiko Hashimoto, Kadoma (JP); Tomonori Mukaigawa, Tokyo (JP); Ryuichi Kubo, Nagaokakyo (JP); Hiroyuki Kishihara, Kyoto (JP); Tatsuro Usuki, Moriguchi (JP); Minoru Noda, Suita (JP); Masanori Okuyama, 16-13, Uneosaka 1-chome, Toyonaka-shi, Osaka (JP)

(73) Assignees: Matshushita Electric Industrial Co., Ltd., Kadoma (JP); Hochiki Corporation, Tokyo (JP); Murata Manufacturing Co., Ltd., Nagaokakyo (JP); Sanyo Electric Co., Ltd., Moriguchi (JP); Masanori Okuyama, Toyonaka (JP)

( * ) Notice: Subject to any disclaimer, the term of this patent is extended or adjusted under 35 U.S.C. 154(b) by 0 days.

(21) Appl. No.: 09/866,869

(22) Filed: May 30, 2001

(65) Prior Publication Data
US 2002/0004266 A1 Jan. 10, 2002

(30) Foreign Application Priority Data
Jun. 1, 2000 (JP) ........................................ 2000-164921

(51) Int. Cl.$^7$ ............................................... H01L 21/31
(52) U.S. Cl. ........................ 438/778; 118/720; 118/722
(58) Field of Search ................................ 118/720, 721, 118/722

(56) References Cited

U.S. PATENT DOCUMENTS 4,676,194 A * 6/1987 Satou et al. ................. 118/720
5,178,682 A * 1/1993 Tsukamoto et al. ......... 118/722

OTHER PUBLICATIONS

Hsiu–Fung Cheng, et al., "Ferroelectric Properties of $(Pb_xLa_{1-x})(Zr_yTi_{1-y})O_3$ Thin Films Prepared by Modified Pulsed Laser Deposition Process"; Jpn. J. Appl. Phys., vol. 40(2001) pp. 234–238, Part 1, No. 1, Jan. 2001.

Young Kim, Soon–Gul Lee et al.; "Variation of the Preferred Orientation with Thickness in Barium Titanate Thin Films Prepared by Pulsed Laser Deposition", Jpn. J. Appl. Phys., vol. 36(1997) pp. 7307–7311, Part 1, No. 12A, Dec. 1997.

H. Fujita et al., "Control of Crystal Structure and Ferroelectric Properties of $Pb(Zr_xTi_1-x)O_3$ Films Formed by Pulsed Laser Deposition", Jpn. J. Appln. Phys. vol. 39 (2000) pp. 7035–7039, Part 1, No. 12B, Dec. 2000.

Pyroelectric Imagining, Bernard M. Kulwicki et al., Proc. 8$^{th}$IEEE Int. Symp. Appl. Ferroelectronics 1992, pp, 1–10.

* cited by examiner

*Primary Examiner*—David Nelms
*Assistant Examiner*—Thao Le
(74) *Attorney, Agent, or Firm*—Armstrong, Westerman & Hattori, LLP

(57) ABSTRACT

A thin film formation apparatus includes a vacuum chamber, a target holding mount held movably in the vacuum chamber, a target containing a film material, an ArF excimer laser for emitting high energy radiation to a surface of the target, an optical system for concentrating the radiation from the excimer laser to the surface of the target, a substrate holding mount holding the substrate, an oxidizing gas inlet for supplying an oxidizing gas into the vacuum chamber for oxidizing a substance deposited on the substrate, a heater placed inside the substrate holding mount for heating the substrate in the vacuum chamber, and a light for irradiating the substrate held on the substrate holding mount with light rays.

4 Claims, 24 Drawing Sheets

| TARGET | HOT PRESS BST(75/25) |
|---|---|
| SUBSTRATE | Pt/Ti/NSG(400nm)/SiN/SiO/Si(100) |
| SUBSTRATE TEMPERATURE(°C) | 550°C |
| LASER POWER(mJ) | 120mJ(~3J/cm$^2$) |
| LASER FREQUENCY, DEPOSITION TIME | 5Hz,2h |
| AMBIENT GAS O$_2$ | 0.1Torr |
| TARGET-SUBSTRATE DISTANCE | 2.5cm |
| POST ANNEAL | 600°C-30min,0.1Torr O$_2$ |
| COOLING RATE | ≦5°C/min |
| THICKNESS OF DEPOSITED FILM | ≦500nm |

FIG.5

| TARGET | HOT PRESS SBLN |
|---|---|
| SUBSTRATE | Pt/Ti/NSG(400nm)/SiN/SiO/Si(100) |
| SUBSTRATE TEMPERATURE(°C) | 550°C |
| LASER POWER(mJ) | 100mJ(~2.5J/cm$^2$) |
| LASER FREQUENCY, DEPOSITION TIME | 10Hz,2h |
| AMBIENT GAS O$_2$ | 0.05Torr |
| TARGET-SUBSTRATE DISTANCE | 2.5cm |
| POST ANNEAL | 600°C-30min,0.1Torr O$_2$ |
| COOLING RATE | ≦5°C/min |
| THICKNESS OF DEPOSITED FILM | ≦800nm |

APPARATUS AND METHOD FOR FORMING THIN FILM AT LOW TEMPERATURE AND HIGH DEPOSITION RATE

BACKGROUND OF THE INVENTION

1. Field of the Invention

The present invention relates to a thin film formation apparatus for depositing a thin film of ferroelectric material or the like on a substrate and to a method of forming a thin film using the apparatus.

2. Description of the Background Art

[Background Art of Infrared Detecting Element]

Objects and human bodies at room temperature radiate infrared rays (heat rays) of approximately 10 $\mu$m in wavelength which can be measured to detect the presence of them and obtain temperature information without contact. This infrared detection is applied to various uses like automatic door, intruder alarm, cooking monitor of microwave oven, chemical measurement, and the like.

The key device of prime importance for such measurement is an infrared sensor. There are generally two types of infrared sensors, i.e., quantum infrared sensor and thermal infrared sensor.

The quantum infrared sensor is highly sensitive and excellent in sensing ability while it requires cooling resulting in increase in size of the entire device and thus has a problem in practical use. On the other hand, the thermal infrared sensor is somewhat inferior to the quantum infrared sensor in terms of sensitivity while it is appropriate for practical use because of its advantage that operation at room temperature is possible.

Accordingly, various thermal infrared sensors have been proposed including those utilizing pyroelectric effect, resistance bolometer, dielectric bolometer, thermopile, Golay cell, and the like. For example, an infrared image sensor using the pyroelectric effect is disclosed in Proc. 8th IEEE Int. Symp. Appl. Ferroelectronics (1992), pp. 1–10 ("PYROELECTRIC IMAGING" by Bernard M. Kulwicki et al.).

In particular, the dielectric bolometer which applies electric field to detect the change of dielectric constant with respect to temperature has a higher sensitivity than those of other sensors and it requires no chopper. Because of these excellent features, the dielectric bolometers are considered prospective in terms of practical use.

Further, an advanced infrared sensing is expected that is applied to infrared image sensors (thermography) capable of providing temperature distribution of objects and scenery without contact.

[Background Art of Ferroelectric Material for Infrared Detecting Element]

In order to enhance the performance of an infrared detecting element used for the infrared image sensors and the like mentioned above, it is necessary that the material constituting the infrared detecting element has a high sensing sensitivity.

In other words, if a pyroelectric (PE) bolometer utilizing pyroelectric effect is used as an infrared sensor, the pyroelectric coefficient must be large at about room temperature. If the dielectric bolometer (DB) explained above is used as an infrared sensor, the change of dielectric constant with respect to temperature must be great at about room temperature.

Materials of importance for these infrared detecting elements include $(Ba_{0.75}Sr_{0.25})TiO_3$ (hereinafter abbreviated as BST) and ferroelectric SBN (strontium barium niobate, $Sr_{1-x}Ba_xNb_2O_6$, $0.25 \leq x \leq 0.75$) crystal having tetragonal tungsten-bronze structure (hereinafter abbreviated as SBN).

SBN particularly exhibits considerably excellent ferroelectric characteristics and the highest pyroelectric coefficient. Moreover, Curie temperature (Tc) of SBN can be varied continuously from 60° C. to 250° C. by controlling Sr/Nb ratio.

In addition, SBN has a feature of diffusion phase transition. Specifically, ferroelectric phase transition occurs in a relatively wide temperature range near Tc with a considerably high and sharp dielectric peak.

As discussed above, the ferroelectric materials having temperature dependencies of both of polarization and dielectric constant as shown in FIG. 26 are applicable to thermal infrared sensors. The former effect is related to conventional pyroelectric (PE) bolometers and the latter effect is related to dielectric bolometers (DB).

Here, in order to achieve a high sensitivity, the material must have its phase transition temperature (Tc) which is close to a range of measuring temperature and the rate of change of dielectric constant with respect to temperature must be increased.

In actual, Tc value of $Sr_{0.48}Ba_{0.52}Nb_2O_6$ is approximately 125° C. It is known that the temperature 125° C. can be reduced to 60° C. by substituting this SBN by 0.5% $La_2O_3$. Moreover, SBN material is very stable since the SBN includes no volatile element such as Pb. Mat. Res. Soc. Symp. Proc. Vol. 243, pp. 557–562 (1992) ("Strontium barium niobate thin films prepared by pulsed laser deposition") reports that a thin film of SBN can be grown by means of laser ablation with stoichiometry exactly identical to a target.

Infrared sensors like those described above are arranged in the form of an array to be integrated with a high density so as to produce an infrared image sensor. Then, an array of dielectric ceramic and switching elements like silicon FET (Field Effect Transistor) should be formed on the same semiconductor substrate. It accordingly means that there should be conformity between a process of forming switching elements or the like and a process of forming infrared detecting elements, for example, it is necessary that dielectric ceramic should be formed at low temperature without deteriorated in its characteristics onto a metal electrode formed on a semiconductor substrate.

However, the laser ablation which has conventionally been employed has problems that the deposition temperature is not sufficiently low and that the deposition rate of a ferroelectric thin film is low.

SUMMARY OF THE INVENTION

One object of the present invention is to provide a thin film formation apparatus and a thin film formation method by which a thin film of ferroelectric or the like suitable for an infrared detecting element having a high sensing sensitivity can be formed on a substrate.

Another object of the invention is to provide a thin film formation apparatus and a thin film formation method by which a ferroelectric thin film can be manufactured with an enough conformity to a process of forming a device like transistor formed on a semiconductor substrate in an infrared two-dimensional image sensor or the like.

In summary, according to an aspect of the invention, the present invention is a thin film formation apparatus including a vacuum chamber, a target unit, a high energy radiation source, an optical device, a substrate holding unit, an oxidizing gas inlet unit, a heating unit, and a first irradiation unit.

The target unit is provided at a predetermined position in the vacuum chamber and can fix a target containing a film material. The high energy radiation source emits high energy radiation to a surface of the target fixed to the target unit. The optical device concentrates the high energy radiation to the target fixed to the target unit. The substrate holding unit is provided to face the target unit and holds a substrate for depositing thereon a substance ejected from the target by the high energy radiation. The oxidizing gas inlet unit supplies an oxidizing gas into the vacuum chamber so as to oxidize the substance deposited on the substrate. The heating unit heats the substrate in the vacuum chamber. The first irradiation unit irradiates with activation light rays the substrate held by the substrate holding unit.

According to another aspect of the invention, a thin film formation apparatus includes a vacuum chamber, a target unit, a high energy radiation source, an optical device, a substrate holding unit, an oxidizing gas inlet unit, a heating unit, and a first irradiation unit.

The target unit is provided at a predetermined position in the vacuum chamber and can fix a target containing a film material. The high energy radiation source emits high energy radiation to a surface of the target fixed to the target unit. The optical device concentrates the high energy radiation to the target fixed to the target unit. The substrate holding unit is provided to face the target unit and holds a substrate for depositing thereon a substance ejected from the target by the high energy radiation. The oxidizing gas inlet unit supplies an oxidizing gas into the vacuum chamber so as to oxidize the substance deposited on the substrate. The heating unit heats the substrate in the vacuum chamber. The first irradiation unit irradiates with activation light rays the target fixed by the target unit.

According to still another aspect of the invention, a method of forming a thin film includes the steps of: placing a target at a predetermined position in a vacuum chamber, placing a substrate to face the target and decompressing the target and the substrate in the vacuum chamber; heating the substrate in the vacuum chamber; irradiating the substrate with activation light rays; supplying an oxidizing gas into the vacuum chamber for oxidizing a substance to be deposited on the substrate; and emitting high energy radiation to concentrate the radiation to a surface of the target and depositing a substance ejected from the target on the substrate.

According to a further aspect of the invention, a method of forming a thin film includes the steps of: placing a target at a predetermined position in a vacuum chamber, placing a substrate to face the target and decompressing the target and the substrate in the vacuum chamber; heating the substrate in the vacuum chamber; irradiating the target with activation light rays; supplying an oxidizing gas into the vacuum chamber for oxidizing a substance to be deposited on the substrate; and emitting high energy radiation to concentrate the radiation to a surface of the target and depositing a substance ejected from the target on the substrate.

According to a still further aspect of the invention, a method of forming a thin film includes the steps of: applying an organic metal film onto a substrate and annealing the organic metal film in an oxidizing gas ambient to form an inorganic film on the substrate; placing a cylindrical target at a predetermined position in a vacuum chamber, placing the substrate having the inorganic film formed thereon such that the substrate faces the target, and decompressing the target and the substrate in the vacuum chamber; heating the substrate in the vacuum chamber; irradiating the substrate with activation light rays; supplying an oxidizing gas into the vacuum chamber for oxidizing a substance to be deposited on the substrate; and emitting high energy radiation to concentrate the radiation to a surface of the target and depositing a substance ejected from the target on the substrate.

The step of depositing the substance ejected from the target on the substrate includes the steps of rotating the cylindrical target on the central axis of the cylindrical target, and moving the substrate in parallel with the central axis of the cylindrical target.

According to a still further aspect of the invention, a method of forming a thin film includes the steps of: applying an organic metal film onto a substrate and annealing the organic metal film in an oxidizing gas ambient to form an inorganic film on the substrate; placing a cylindrical target at a predetermined position in a vacuum chamber, placing the substrate having the inorganic film formed thereon such that the substrate faces the target, and decompressing the target and the substrate in the vacuum chamber; heating the substrate in the vacuum chamber; irradiating the target with activation light rays; supplying an oxidizing gas into the vacuum chamber for oxidizing a substance to be deposited on the substrate; and emitting high energy radiation to concentrate the radiation to a surface of the target and depositing a substance ejected from the target on the substrate.

The step of depositing the substance ejected from the target on the substrate includes the steps of rotating the cylindrical target on the central axis of the cylindrical target, and moving the substrate in parallel with the central axis of the cylindrical target.

The thin film formation apparatus and method according to the present invention can thus be used to form a ferroelectric thin film so as to achieve an infrared detecting element of a simple structure that is highly sensitive at room temperature. Moreover, such infrared detecting elements can be arranged in a two-dimensional array to achieve an infrared two-dimensional image sensor operating at room temperature with a high sensitivity and highly dense pixels.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows conditions for depositing an SBN thin film.

DESCRIPTION OF THE PREFERRED EMBODIMENTS

Embodiments of the present invention are hereinafter described in conjunction with the drawings.

[First Embodiment]

[Structure of Thin Film Formation Apparatus]

Figure 1:
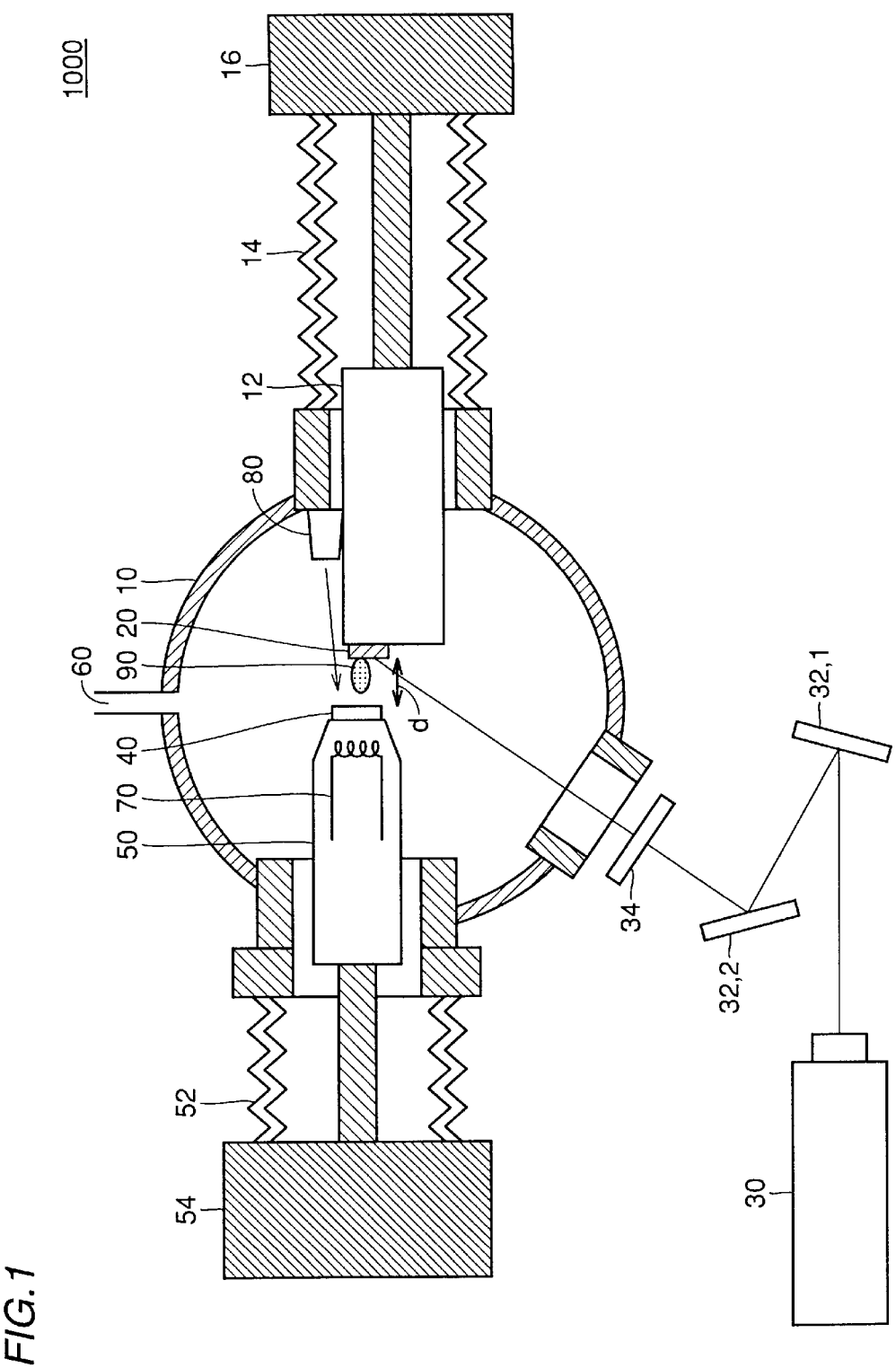
FIG. 1 is a block diagram illustrating a structure of a thin film formation apparatus 1000 according to a first embodiment of the present invention.

FIG. 1 is a block diagram illustrating a structure of a thin film formation apparatus 1000 according to a first embodiment of the present invention.

Referring to FIG. 1, thin film formation apparatus 1000 includes a vacuum chamber 10 with a back pressure which can be decreased to approximately $1\times10^{-5}$ Pa or lower, a target holding mount 12 held movably in the vacuum chamber by bellows 14 and an operation unit 16, a target 20 containing a film material and fixed on target holding mount 12, an ArF excimer laser 30 for emitting to a surface of target 20 high energy radiation, ultraviolet rays (wavelength 193 nm) for example, an optical system consisting of mirrors 32.1 and 32.2 and a lens 34 for concentrating the radiation from the excimer laser onto the surface of target 20, a substrate holding mount 50 provided to face target holding mount 12 and holding a substrate 40 for depositing thereon substances ejected from the target by radiation from excimer laser 30, bellows 52 and an operation unit 54 for holding substrate holding mount 50 movably in the vacuum chamber, an oxidizing gas inlet 60 for supplying an oxidizing gas into vacuum chamber 10 for oxidizing substances deposited on substrate 40, a heater 70 provided in substrate holding mount 50 for heating the substrate in vacuum chamber 10, and a light 80 for irradiating substrate 40 held on substrate holding mount 50 with light rays. It is noted that a plume 90 in the drawings conceptually represents substances ejected from target 20.

Such gas as $O_2$, $O_3$, $N_2O$, $SO_2$ or the like can be used as the oxidizing gas.

The light rays emitted from light 80 may be infrared (IR) rays or vacuum ultraviolet (UV) rays. Light 80 irradiates the entire surface of substrate 40. Light 80 can be used to activate chemical reaction by increasing the temperature of only a part of the substrate surface on which substances are deposited and which is irradiated with light rays or by photochemical reaction. Such light rays for activating chemical reaction are hereinafter referred to "activation light rays."

Although excimer laser 30 is used according to the description above, multi-laser, large-area laser, free electron laser or the like may be used.

The laser frequency is approximately 1 to 10 Hz and the degree of vacuum in vacuum chamber 10 is approximately 1.3 Pa to 67 Pa in a deposition process.

Figures 2, 3:
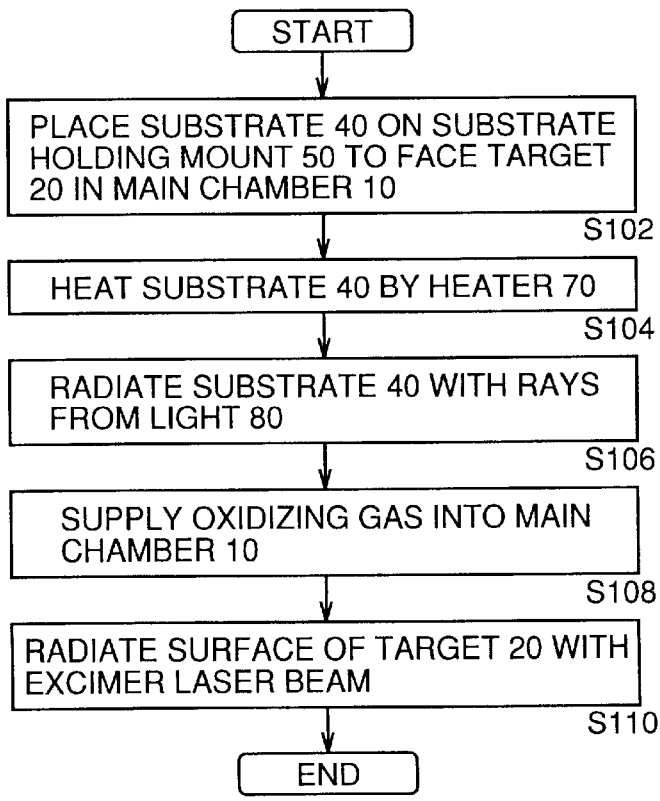
FIG. 2 shows conditions for depositing a BST thin film.
FIG. 3 is a flowchart showing a deposition process according to the first embodiment.

FIG. 2 particularly shows conditions for deposition when a BST thin film is deposited.

As target 40, a hot press sintered body is used that is adjusted to stoichiometric ratio of BST. The substrate is formed by depositing on a (100) Si substrate an SiO film, an SiN film, an NSG film (400 nm), a Ti film and a Pt film and patterning them for making it possible to take measurements of film characteristics. The Pt/Ti film serves as a base electrode for measurement of the dielectric constant or the like.

The target-substrate distance refers to distance d in FIG. 1. Under these conditions, the deposition rate of the film achieved is typically 4 nm/min which is improved compared with the rate of 2 to 3 nm/min accomplished by the conventional laser aberration.

As radiation from light 80, UV rays of 250 nm in wavelength is used.

It is noted that, in the following discussion, the target-substrate distance is constant, i.e., 2.5 cm and post annealing is not performed except for the case described later.

[Formation of Ferroelectric Thin Film (BST Film)]

A procedure of forming a BST ferroelectric thin film is detailed below.

A powder target is prepared and a thin film is then grown on a Pt/Ti/NSG/SiN/SiO$_2$/Si (100) substrate by means of a pulsed laser ablation deposition method as discussed above.

[Conditions of Thin Film Growth]

The target is prepared by pressure forming of hot press of a mixture of finely ground powder of $SrCO_3$, $BaCO_3$ and $TiO_2$ (at least 99.5% in purity) into a shape of cylindrical pellet.

Here, respective contents of Ba, Sr and Ti are controlled to have a ratio of 0.75:0.25:1, according to the nominal composition of $(Ba_{0.75}Sr_{0.25})TiO_3$.

The pellet is continuously sintered in the air at 800° C. for 2 hours and then at 1150° C. for 2 hours in order to improve the mechanical strength, however, the particulars are not restrictions.

FIG. 3 is a flowchart presented for explaining a process of deposition according to the first embodiment.

Referring to FIG. 3, the deposition process follows the procedure detailed below.

Substrate 40 is first set in a preparation chamber (not shown) and thereafter moved into main chamber 10 with its air discharged by a turbo molecular pump in advance to a background pressure [<$2.7 \times 10^{-6}$ Pa ($2 \times 10^{-8}$ Torr)] to a high degree of vacuum.

Substrate 40 is attached onto substrate holding mount 50 which is heated by heater 70, and the substrate temperature (Ts) is maintained at approximately 550° C. during a film deposition period by using a PID temperature controller (step S104). At the same time, UV rays are radiated from light 80 to the substrate during the deposition period (step S106).

$O_2$ ($N_2O$ may be used instead) is supplied into the chamber at a molecule flow rate of 300 sccm, however, this is not restriction. The ambient pressure at this time is adjusted at 13.3 Pa (0.1 Torr) during the film deposition period by controlling the turbo speed of a TMP (step S108).

An ArF excimer laser can be employed as the excimer laser that has a wavelength ($\lambda$) of 193 nm and operates at a repetition rate of 5 shots/sec. Here, the laser beam from the excimer laser is reflected by three mirrors to focus it on the target surface at an incident angle of 45° to evaporate the target material (step S110).

The laser emits the beam under the conditions that the laser fluence is set at 120 mJ and the beam size on the target surface is approximately $0.2 \times 5$ mm$^2$ for example. Under these conditions, the energy density on the target surface is approximately 2 J/cm$^2$ because of an energy loss in beam propagation.

The substrate, on which the target material evaporating from the target is deposited, is spaced by the distance of 2.5 cm from the target as mentioned above.

Under the conditions, the growth rate is approximately 250 nm/h which corresponds to 0.014 nm/pulse.

[Evaluation of BST Film Orientation]

Figure 4:
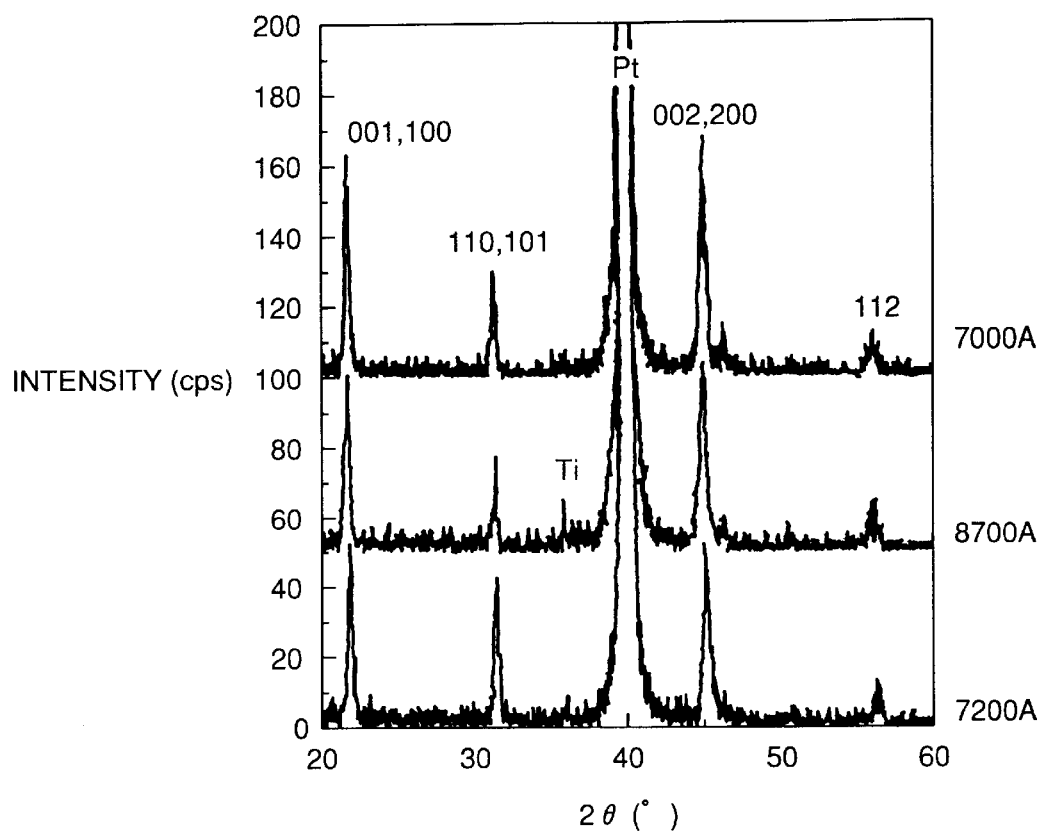
FIG. 4 shows XRD profiles of BST films.

FIG. 4 shows XRD (x-ray diffraction) profiles of BST films thus produced.

As seen from FIG. 4, the thin films formed through the above process have a high degree of orientation. FIG. 4 shows respective profiles of various film thicknesses.

[Formation of $Sr_{0.5}Ba_{0.5}Nb_2O_6$ (SBN) Thin Film]

According to the discussion above, the substrate temperature is made constant during the film deposition period to deposit a film.

In the following description, the apparatus shown in FIG. 1 is used, and, among the film deposition conditions, the target composition is adapted to the stoichiometric ratio of an SBN film and the substrate temperature is varied step by step in the sequence indicated below. Then, characteristics of a deposited film are evaluated.

The temperature is changed in a sequence, from an intermediate temperature to a high temperature and further to a low temperature. For example, the temperature is changed from 550° C. for 30 minutes to 650° C. for 30 minutes and further to 500° C. for one hour, for example. However, the particulars are not restrictions.

Conditions of film deposition are shown in FIG. 5 except for the change of substrate temperature.

The substrate temperature in FIG. 5 is an initial temperature.

[Electrical Characteristics of Thin Film]

The thin film thus deposited has electrical characteristics as described below.

For the substrate, a thermally oxidized Si (100) wafer is used and a double-layered metal film of Pt (300 nm)/Ti (150 nm) is deposited by RF magnetron sputtering at room temperature for taking electrical measurements.

In order to accomplish a Pt/SBN/Pt capacitor structure for measurement of electrical characteristics, RF magnetron sputtering is performed to form dot-like Pt electrodes of three diameters 0.1, 0.2 and 0.5 mm on the upper surface of the thin film by means of a metal mask.

Figure 6:
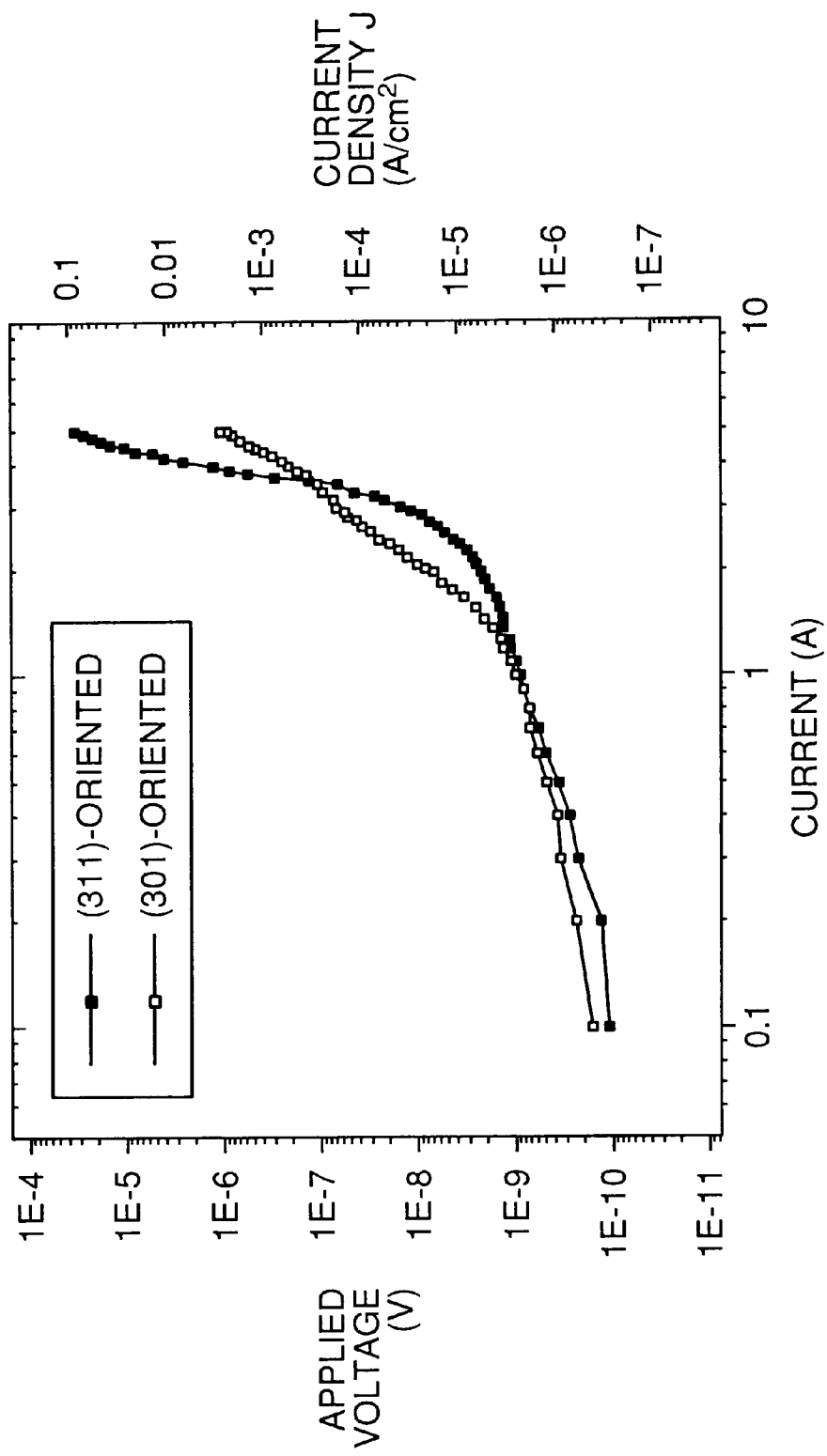
FIG. 6 shows, regarding SBN films of (001) orientation and (311) orientation, dependency of current density J on applied voltage V.

As shown in FIG. 6, SBN films of (001) orientation and (311) orientation having a Pt/SBN/Pt/Ti capacitor structure exhibit the dependency of current density J on applied voltage V.

It is noted that the characteristics of (311) orientation shown in FIG. 6 correspond to growth conditions in an oxide ambient.

A positive bias is applied to an upper electrode to measure a leakage current density at room temperature.

All films exhibit low ohmic conduction ($\partial 1$ nJ/$\partial 1$ nV$\approx 1$) and a low current density lower than $10^{-5}$ A/cm$^2$ relative to applied bias to a transition voltage of approximately 2 V.

This corresponds to an applied electric field of 20 kV/cm to an SBLN film of 1 $\mu$m in thickness. When the voltage exceeds the transition voltage, the current density immediately increases at an inclination of ($\partial 1$ nJ/$\partial 1$ nV)$\cong 7$ to 10.

The leakage current density level of approximately 200 nA/cm$^2$ for 1.5 V is still enough to enable a sufficient sensor operation.

[Second Embodiment]

Figure 7:
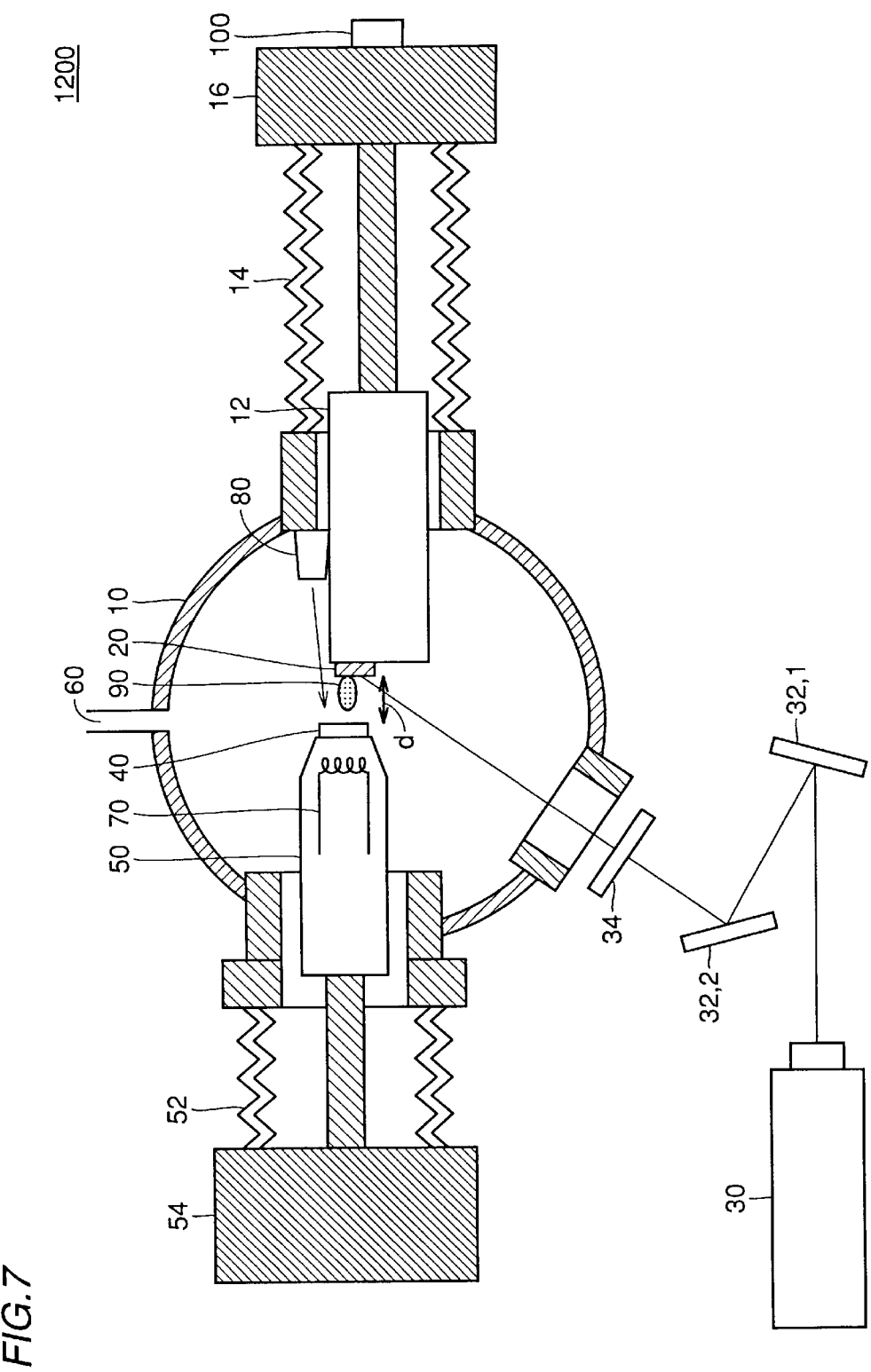
FIG. 7 is a block diagram illustrating a structure of a thin film formation apparatus 1200 according to a second embodiment.

FIG. 7 is a block diagram illustrating a structure of a thin film formation apparatus 1200 according to a second embodiment.

The apparatus of the second embodiment is different from thin film formation apparatus 1000 in the first embodiment in that the former has a structure including a rotating unit 100 which can externally cause a target holding unit 12 to rotate on its axis. Although there is no particular limitation on rotating unit 100, rotating unit 100 is dynamically coupled to target holding unit 12 by magnetic force of a magnet for example to rotate target holding unit 12 at a predetermined rate of rotation.

Further, according to the second embodiment, an operation unit 54 continuously moves a substrate 40 relative to the target during a film deposition period.

In the deposition process of the second embodiment, at least in step S1110 of the deposition process shown in FIG. 3, target holding unit 12 rotates on its axis and substrate 40 is moved by operation unit 54 continuously almost in parallel with the central axis of target 20 when target 20 is radiated with the excimer laser beam.

Other details are similar to those of the structure of thin film formation apparatus 1000 of the first embodiment. Therefore, the same components are denoted by the same reference character and description thereof is not repeated here.

Target holding unit 12 is rotated for avoiding a deep crater from being generated due to radiation of the incident laser beam during deposition.

The substrate is moved during the film deposition period for enhancing the uniformity of film thickness on the substrate of a large area.

[Formation of BST Film]

A BST film is deposited by apparatus 1200 shown in FIG. 7 as described below. The conditions of film deposition are basically similar to those shown in FIG. 2 and no post annealing is performed.

Target holding unit 12 is rotated at a rate of 10 rpm while substrate 40 is moved at a rate of 3 cm/min in a width of ±3 cm.

Figure 8:
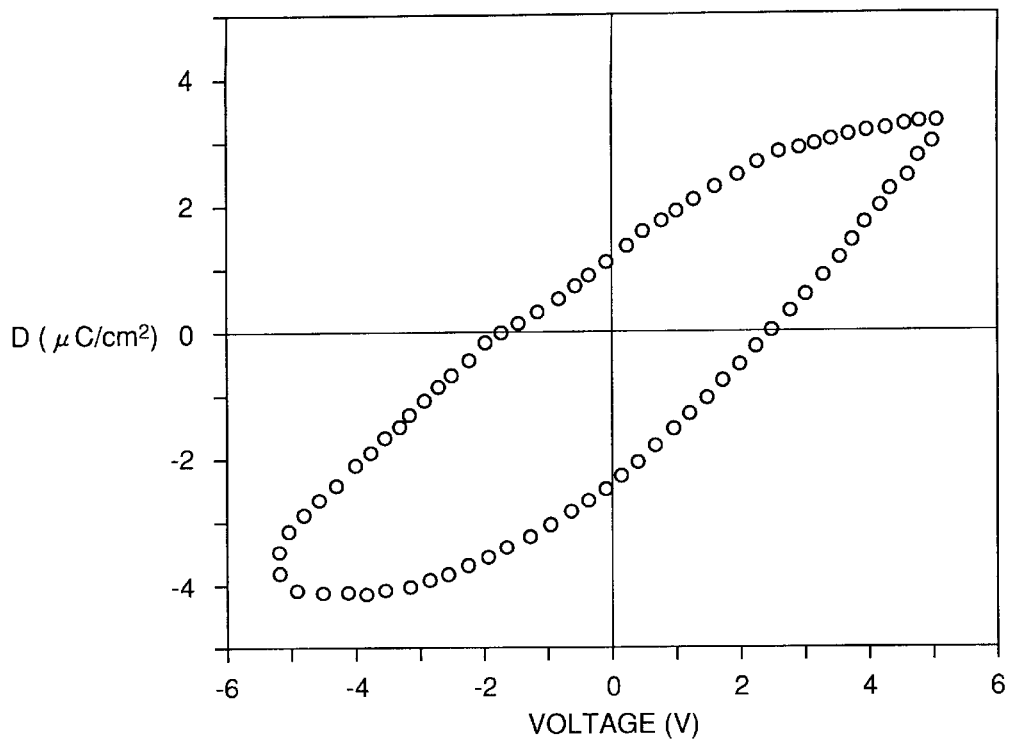
FIG. 8 shows a D-V hysteresis curve of a BST film.

FIG. 8 shows a D-V hysteresis curve of the BST film formed under the conditions above. The BST film has a residual dielectric polarization (Pr) of 1 $\mu C/cm^2$. Coercive electric field (Ec) is ~40 kV/cm.

No post annealing is performed for the example shown in FIG. 8.

[Effect of Post Annealing]

For the BST film shown in FIG. 8, post annealing is not performed after film deposition. However, if the film is post-annealed under a reduced pressure, film characteristics are enhanced.

For example, the post annealing is performed at 550° C. for 3 hours.

Figure 9:
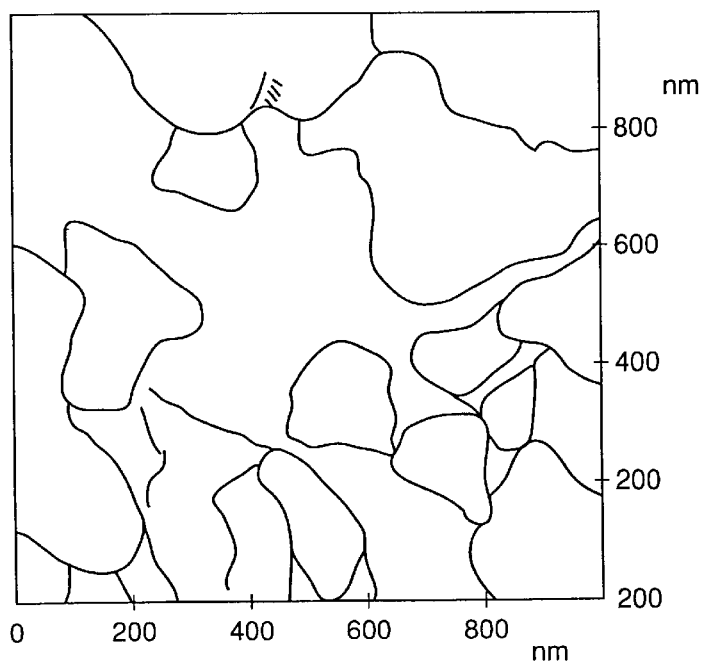
FIG. 9 schematically shows a state of grains of a BST film having its surface observed by an atomic force microscope (AFM).

FIG. 9 schematically shows a state of grains of a resultant BST film having its surface observed by an atomic force microscope (AFM).

As seen from FIG. 9, the grain size is sufficiently large that is approximately 200 nm. The grain size is greater than that achieved when no post annealing is performed under a reduced pressure.

[Formation of $Sr_{0.5}Ba_{0.5}Nb_2O_6$ (SBN) Thin Film]

An SBN film is formed by thin film formation apparatus 1200 of the second embodiment shown in FIG. 7 as discussed below.

The film is formed under the conditions basically similar to those shown in FIG. 5. However, another type of oxidizing gas is supplied in film deposition and post annealing is performed in an oxidizing gas ambient using the same oxidizing gas as that in the film deposition.

The post annealing is performed at a substrate temperature of 600° C. for 3 hours.

Figure 10:
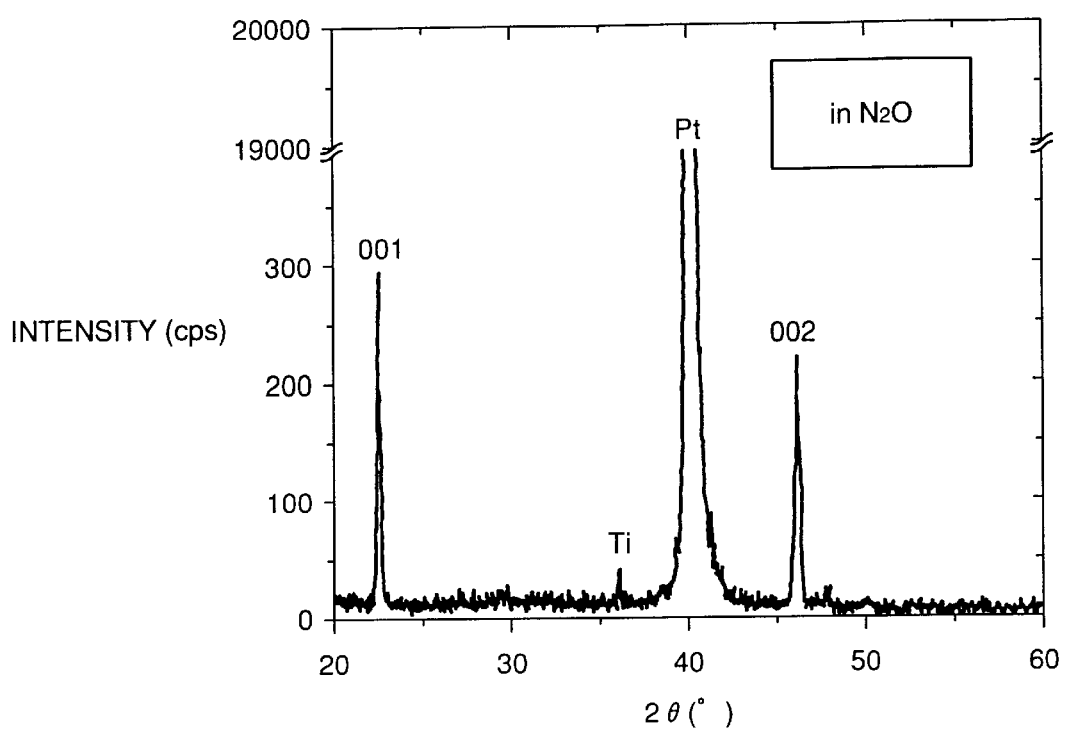
FIG. 10 is a first showing an XRD profile of an SBN film.
Figure 11:
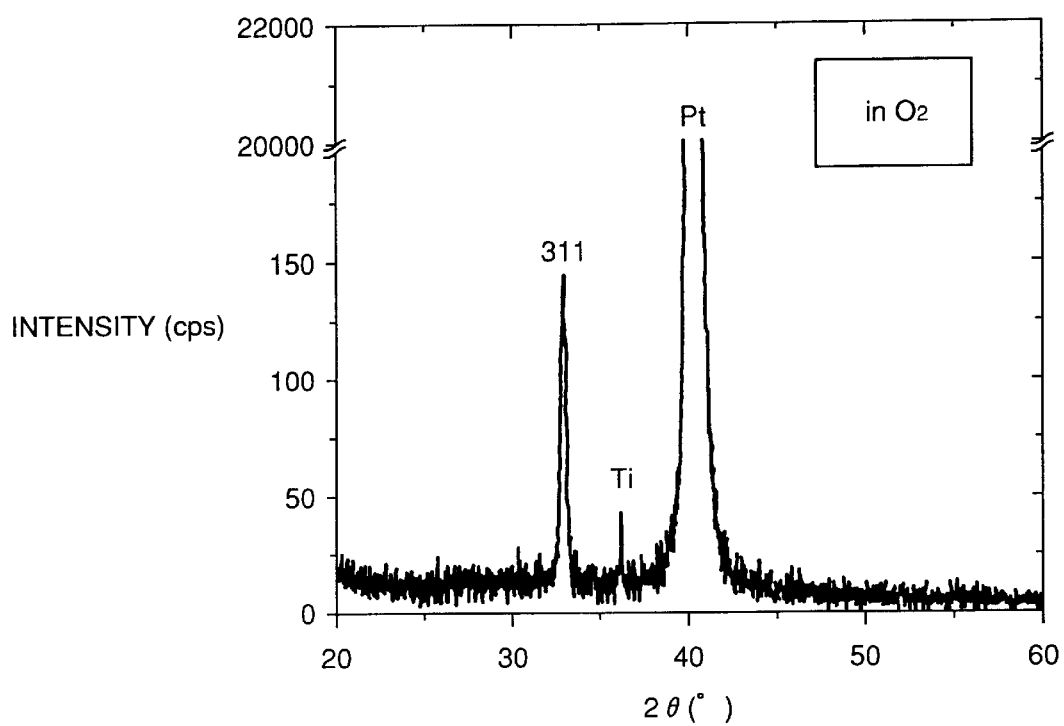
FIG. 11 is a second showing an XRD profile of an SBN film.

FIGS. 10 and 11 show XRD profiles of SBN films thus formed. FIG. 10 shows a profile of an SBN film deposited in an $N_2O$ ambient for which post annealing is performed with the temperature and time conditions mentioned above in the $N_2O$ ambient. FIG. 11 shows a profile of a film deposited in an $O_2$ ambient to which post annealing is performed in the $O_2$ ambient under the temperature and time conditions described above.

The post annealing performed immediately after deposition in an oxidizing gas ambient is considered to compensate for oxygen deficit which could occur in a resultant film.

Referring to FIGS. 10 and 11, the film formed through ablation in the $N_2O$ gas ambient is a (001)-oriented film and the film formed in $O_2$ is a (311)-oriented film.

The orientation of crystal can easily be controlled by means of the gas ambient possibly because of a difference in activity of oxygen radical generated through dissociation of the ambient gas when UV rays are radiated from the excimer laser. The energy of the oxygen radical generated from $N_2O$ is greater than that generated from pure $O_2$ so that the former is advantageous in growth of an SBN film on (001) plane.

The orientation of a ferroelectric thin film can thus be controlled which is important since a film with orientation is considerably preferable for dielectric application.

The post annealing is performed by heating the substrate using heater 70. Alternatively, the post annealing may be accomplished by radiating a substrate on which an SBN film is deposited with light rays from light 80 and heating the substrate following the conditions indicated above in an oxidizing gas supplied into vacuum chamber 10.

Figure 12:
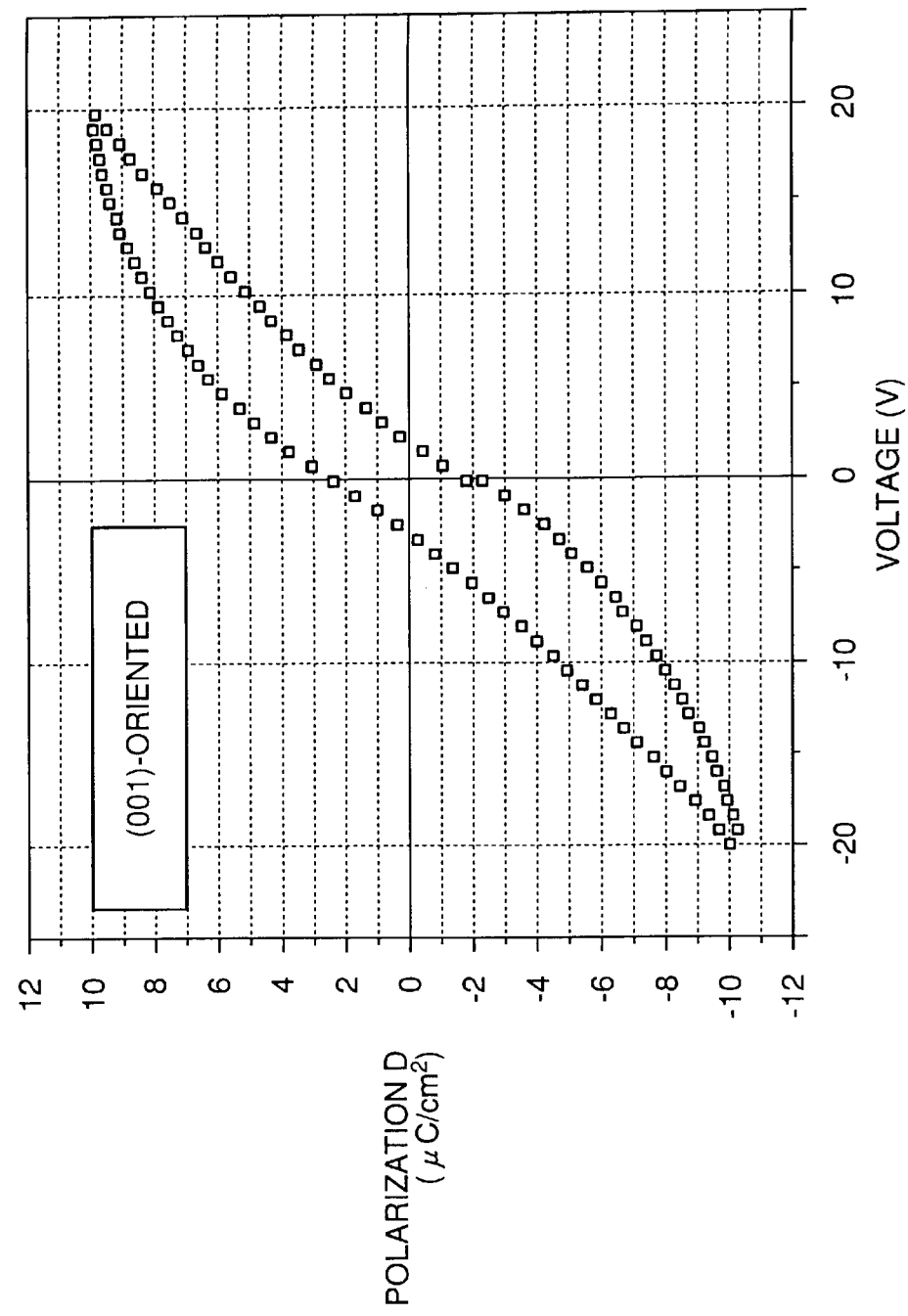
FIG. 12 is a first showing a P-V hysteresis curve of an SBN film.
Figure 13:
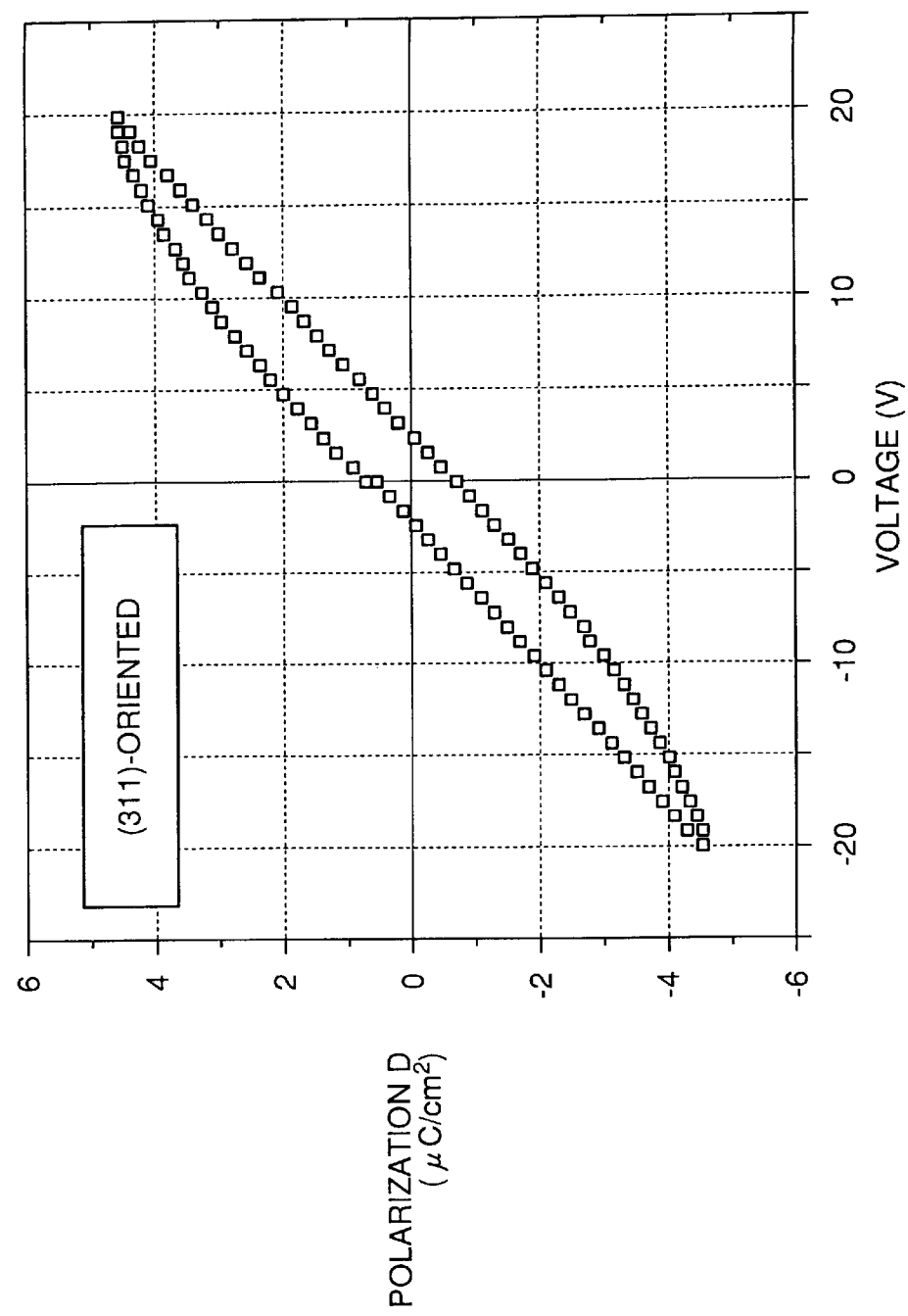
FIG. 13 is a second showing a P-V hysteresis curve of an SBN film.

FIGS. 12 and 13 show P-V hysteresis curves of SBN films formed under the conditions above.

FIG. 12 shows a curve of a film formed in an $N_2O$ ambient and post-annealed while being radiated by light 80 under the above conditions. FIG. 13 shows a curve of a film formed in an $O_2$ ambient and post-annealed while being radiated by light 80 under the above conditions.

Figure 14:
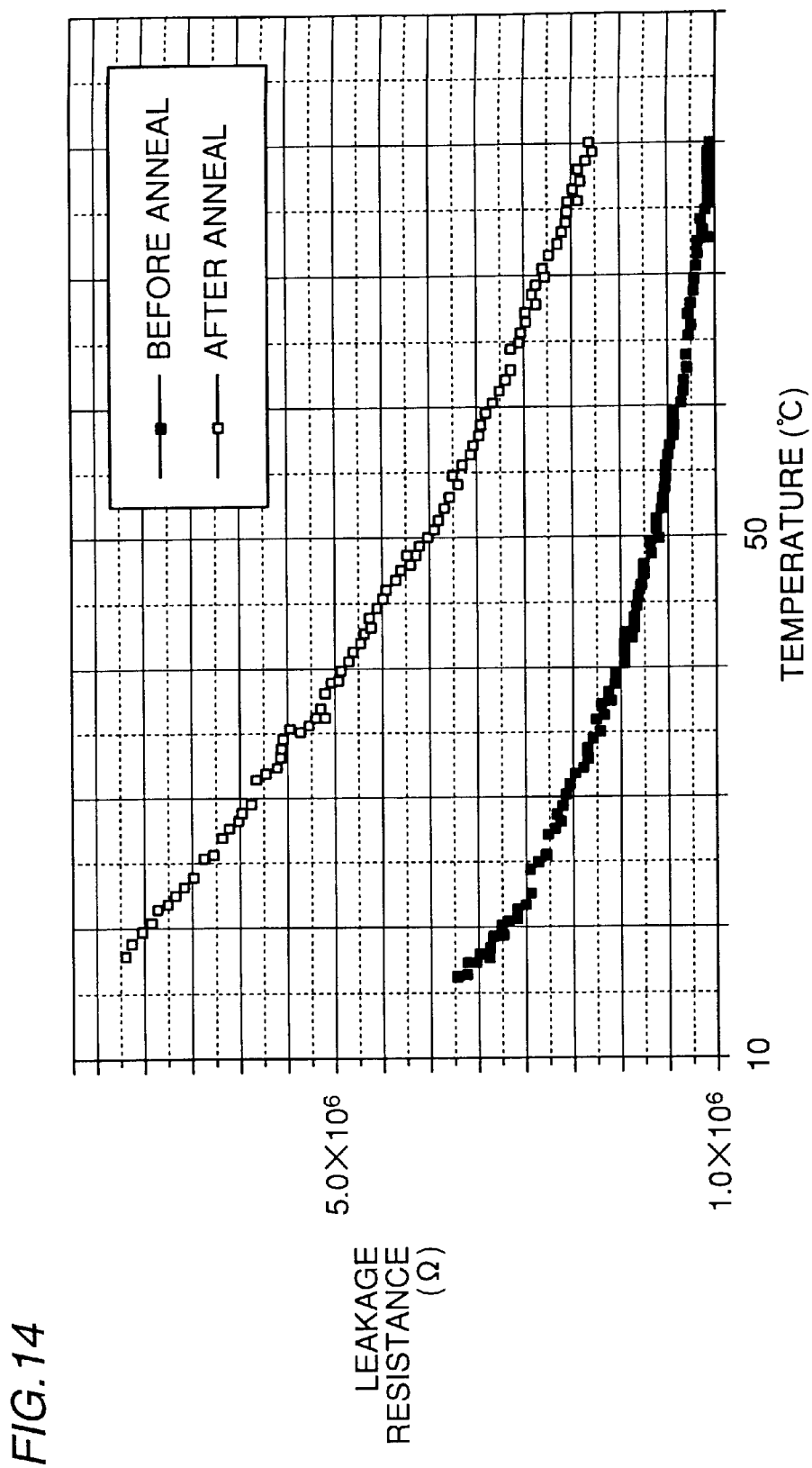
FIG. 14 shows change of resistance with respect of temperature prior to and subsequent to post annealing with irradiation by a light 80.

FIG. 14 shows changes of resistance with respect to temperature prior to and subsequent to post annealing with radiation by light 80 performed therewith. Characteristics of an SBN film formed in an $O_2$ ambient is shown in FIG. 14.

The post annealing causes the film resistance to become almost quadruple and thus a remarkable improvement in film characteristics is achieved.

[Third Embodiment]

Figure 15:
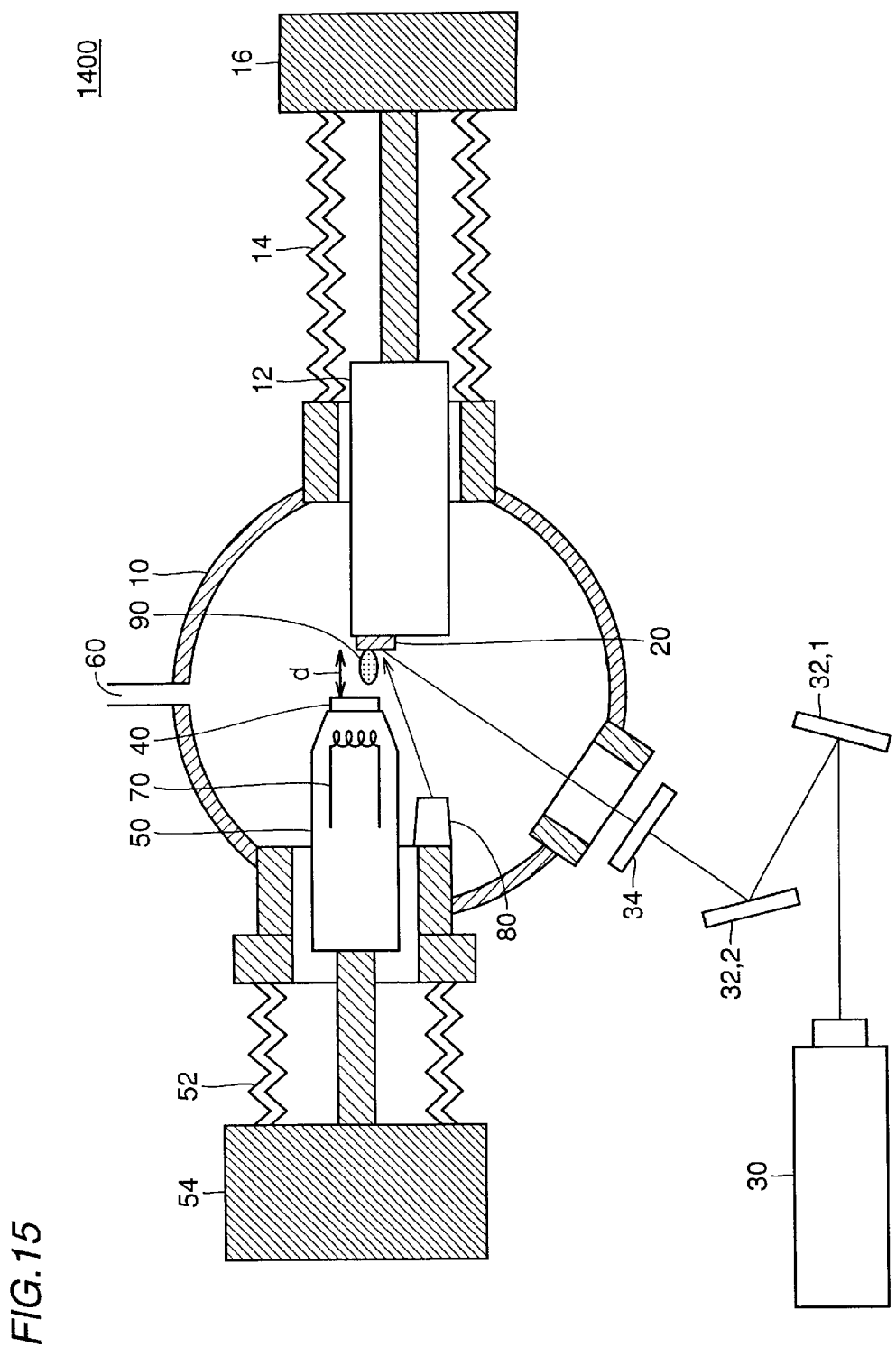
FIG. 15 is a block diagram illustrating a structure of a thin film formation apparatus 1400 according to a third embodiment.

FIG. 15 is a block diagram illustrating a structure of a thin film formation apparatus 1400 according to a third embodiment.

The apparatus of the third embodiment differs from thin film formation apparatus 1000 in the first embodiment in that the former has a structure using a light 80 to radiate a target 20 instead of a substrate 40.

Other details are similar to those of the structure of thin film formation apparatus 1000 of the first embodiment. Therefore, the same components are denoted by the same reference character and description thereof is not repeated here.

[Formation of BST Film]

Figure 16:
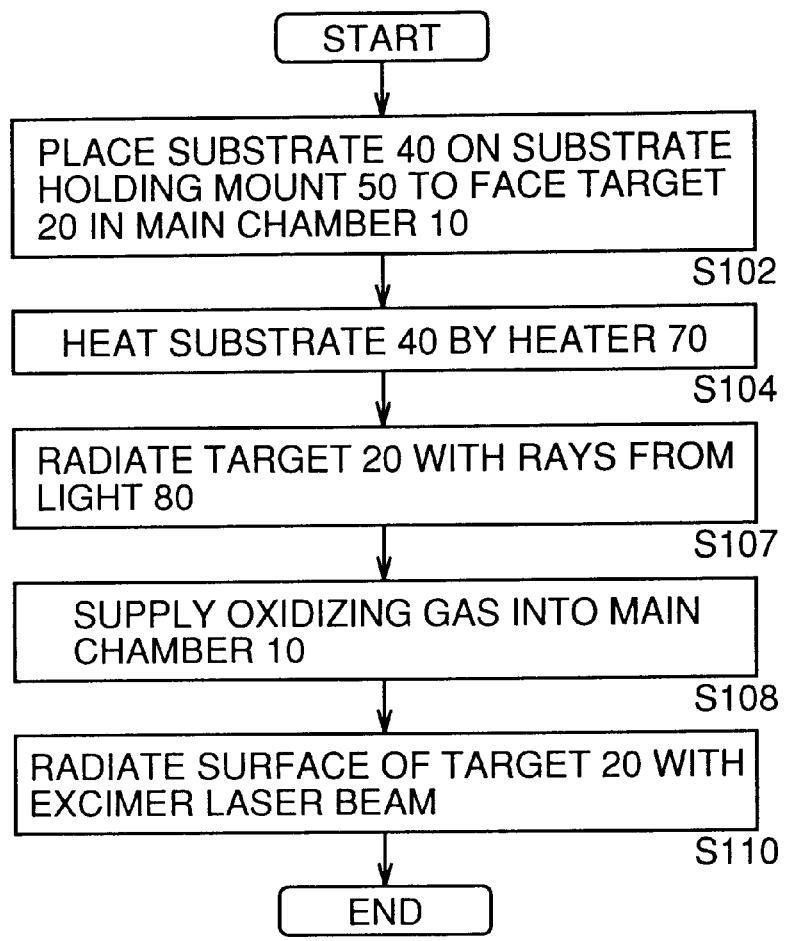
FIG. 16 is a flowchart showing a deposition process by the thin film formation apparatus 1400 shown in FIG. 15.

FIG. 16 is a flowchart showing a deposition process by thin film formation apparatus 1400 in FIG. 15.

The deposition process in FIG. 16 is different from that in FIG. 3 of the first embodiment in that substrate 40 is radiated with light rays by light 80 in step S106 according to the first embodiment, while according to the third embodiment a target 20 is radiated with light rays by light 80 in step S107. Other details are similar to those shown in FIG. 3 of the first embodiment, therefore, description thereof is not repeated.

Figure 17:
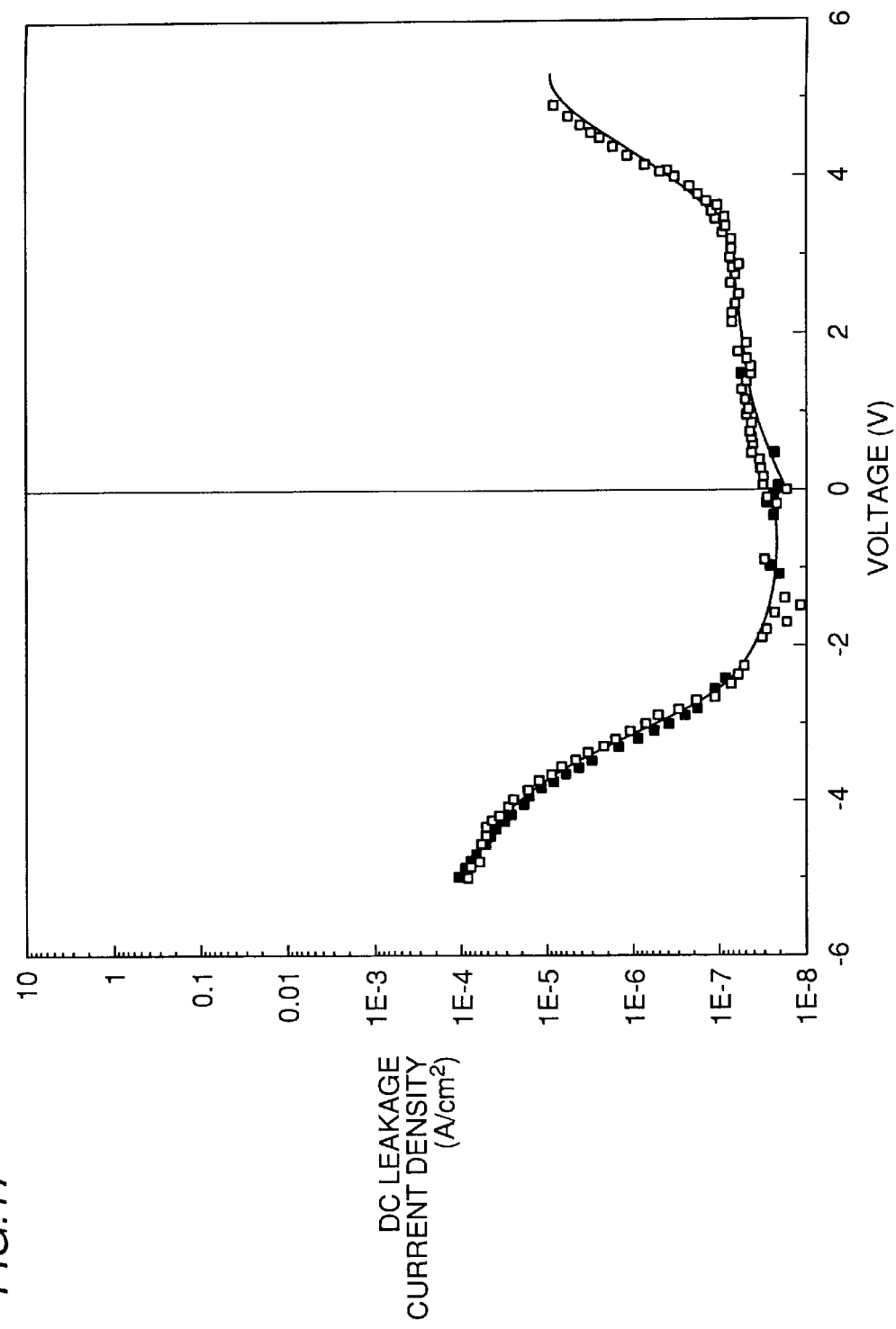
FIG. 17 shows electrical characteristics of a BST film formed by the thin film formation apparatus 1400 under the conditions in FIG. 2.

FIG. 17 shows electrical characteristics of a BST film deposited under the conditions shown in FIG. 2 by means of thin film formation apparatus 1400.

Here, the electrode area is 0.0314 $mm^2$ and the film thickness is 500 nm. In the range of applied voltage from +5 to −5 V (corresponding to electric field of $10^4$ kV/m), a desirable BST film having a small leakage current is formed.

[Formation of SBN Film]

Apparatus 1400 of the third embodiment shown in FIG. 15 is used to form a film under the conditions in FIG. 5 except that the ambient gas is changed and the substrate temperature is varied step by step in the sequence indicated below during a film deposition period. Characteristics of the resultant film are evaluated as follows.

The temperature is varied specifically from an intermediate temperature to a high temperature and further to a low temperature. For example, the temperature is changed from 550° C. for 30 minutes to 650° C. for 30 minutes and then 500° C. for 1 hour. However, the particulars are not restrictions. The substrate temperature in FIG. 5 indicates the initial temperature.

Figure 18:
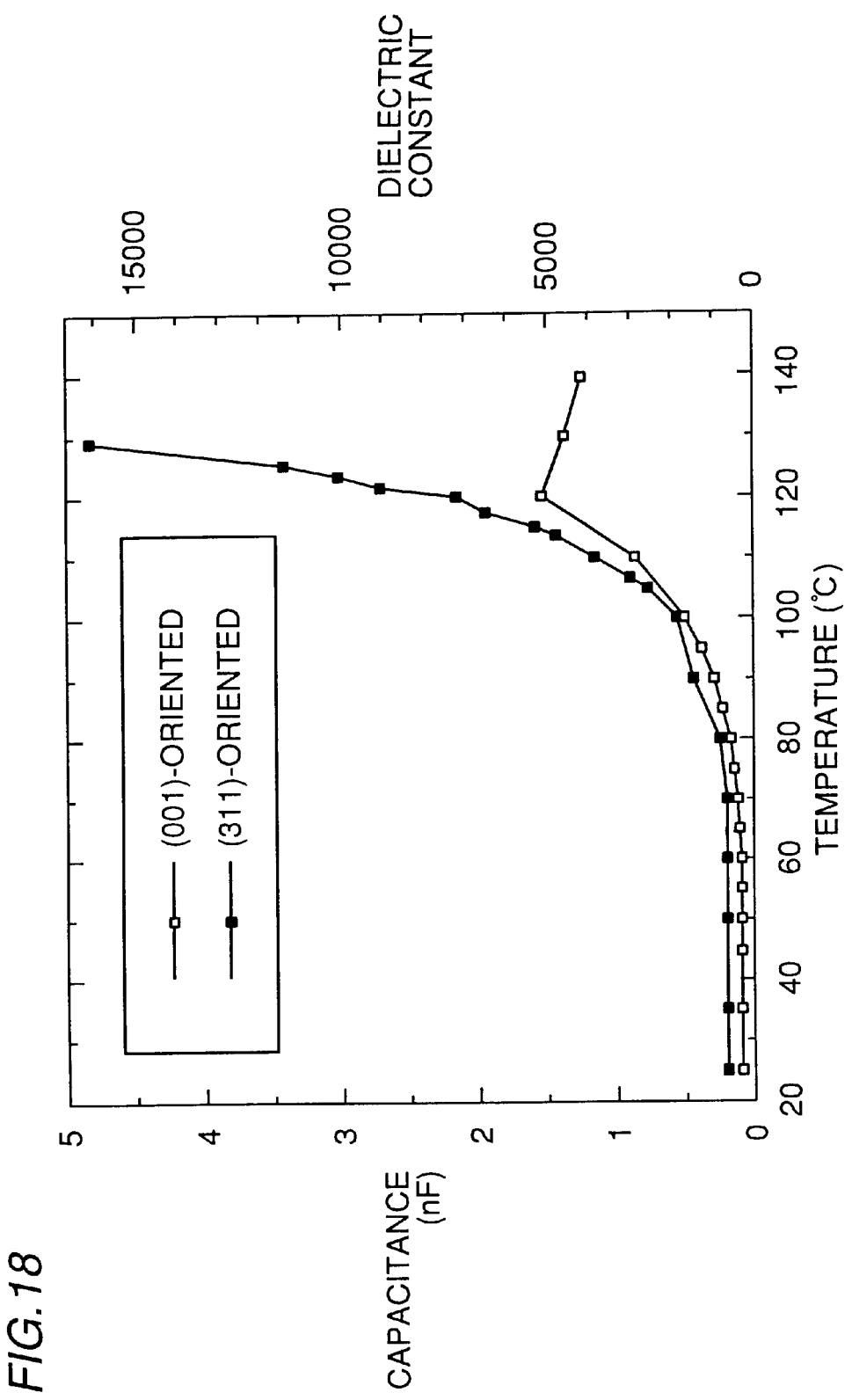
FIG. 18 shows temperature dependencies of capacitance and dielectric constant (εr) regarding two films having different orientations respectively.

FIG. 18 shows, regarding two films thus formed having different orientations, respective dependencies of capacitance and dielectric constant (∈r) on temperature. The different orientations result from difference of the ambient gas for growth. (001) orientation results from film deposition in an $N_2O$ ambient while (311) orientation results from film deposition in an $O_2$ ambient.

Regarding SBN material for a dielectric micro-bolometer, in order to examine response of temperature to capacitance, the capacitance is measured in a wide range with increase of temperature. The capacitance is detected by using sine wave of 1 kHz with amplitude of 1 V.

At a room temperature of 25° C., the dielectric constant and dielectric loss with respect to the film of (001) orientation are equal respectively to 500 and 0.013 that are greater than 200 and 0.02 for the film of (311) orientation. The smaller dielectric loss means that influence of leakage is low. The difference in ∈r is caused by the difference of orientation in films.

The ∈r-T curve exhibits a widely extending sharp portion over the temperature range from 80° C. to 120° C. The film of (001) orientation has a dielectric peak at approximately 120° C.

The film of (311) orientation does not exhibit a dielectric peak even if the temperature rises to 130° C. while a remarkable rate of change of ∈r with temperature (Δ∈r/ΔT) is observed.

The average of (Δ∈r/ΔT) in the temperature range from 80° C. to 120° C. is approximately 100 $K^{-1}$ concerning both films of (001) orientation and (311) orientation.

Figure 19:
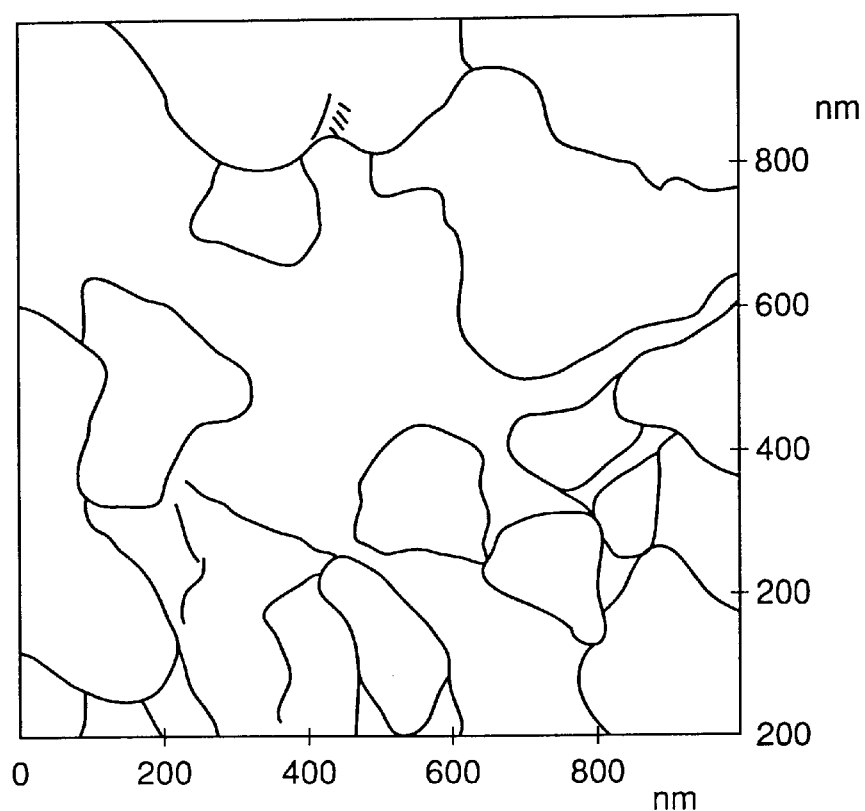
FIG. 19 schematically shows a state of grains of an SBN film having its surface observed by an atomic force microscope (AFM).

FIG. 19 schematically shows a state of grains on the surface of an SBN film thus formed that is observed by using an atomic force microscope (AFM).

As seen from FIG. 19, the grain size is large enough that is approximately 200 nm.

[Fourth Embodiment]

Figure 20:
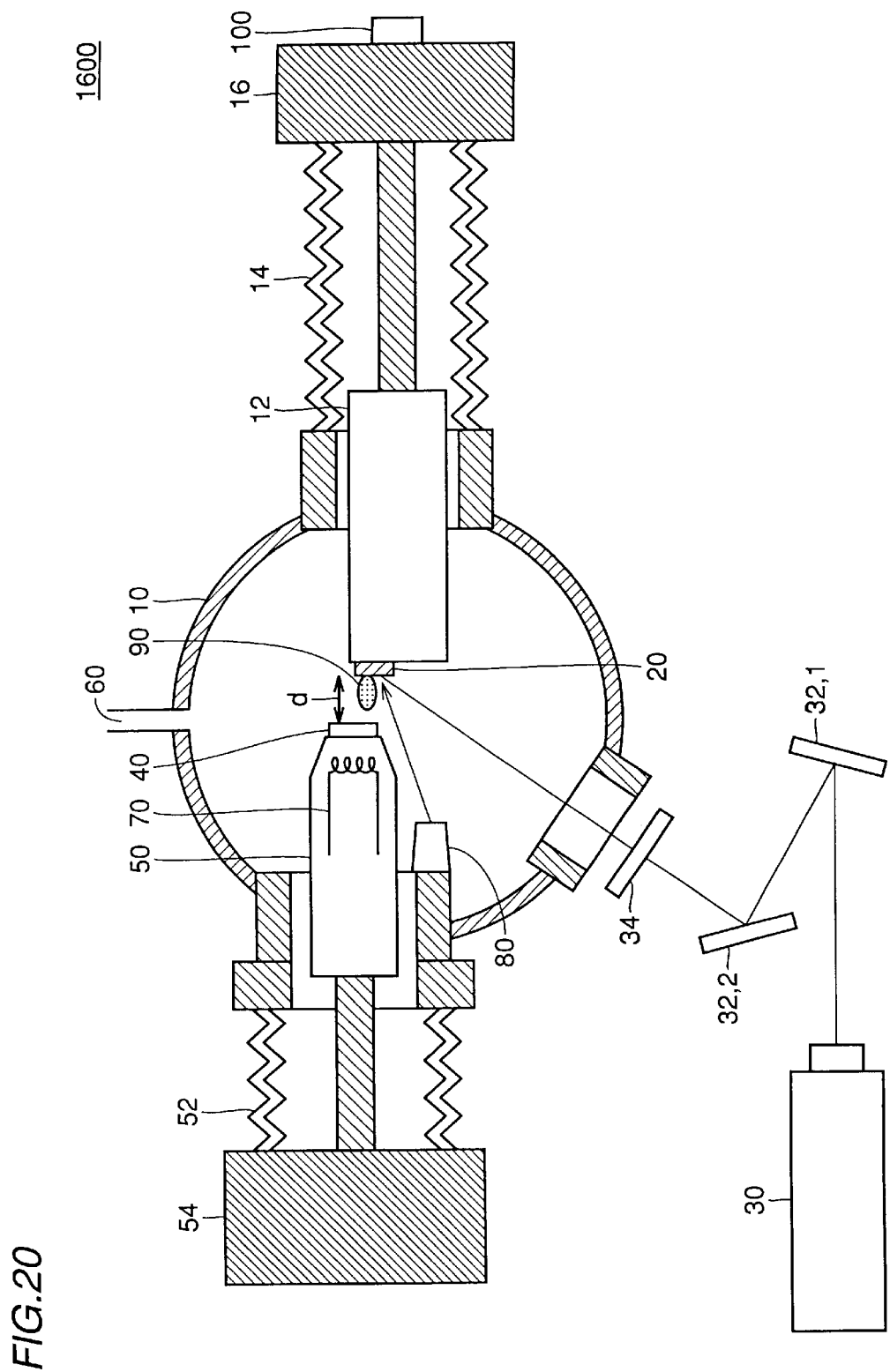
FIG. 20 is a block diagram illustrating a structure of a thin film formation apparatus 1600 according to a fourth embodiment.

FIG. 20 is a block diagram showing a structure of a thin film formation apparatus 1600 according to a fourth embodiment.

Apparatus 1600 is different from thin film formation apparatus 1200 of the second embodiment shown in FIG. 7 in that the former has a structure using a light 80 to radiate a target 20 instead of substrate 40. A target holding unit 12 is rotatable on its axis and substrate 40 is movable relative to the target as the second embodiment.

Accordingly, in the deposition process by thin film formation apparatus 1600, at least in step S110 of the deposition process of the third embodiment shown in FIG. 16, target holding unit 12 rotates on its axis and substrate 40 is moved by operation unit 54 continuously almost in parallel with the central axis of target 20 when target 20 is radiated with the excimer laser beam.

Other details are similar to those of the structure of thin film formation apparatus 1200 of the second embodiment and accordingly the same components are indicated by the same reference character and description thereof is not repeated.

[Formation of BST Film]

Figure 21:
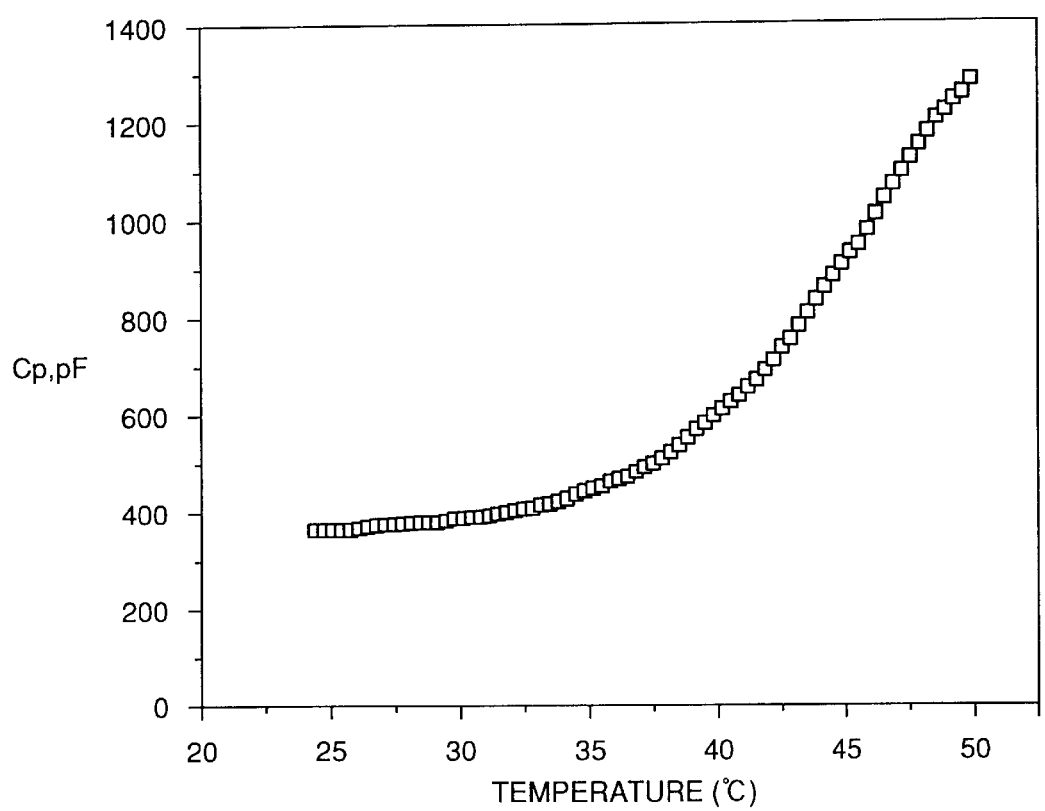
FIG. 21 shows C-T characteristics of a BST film formed by the thin film formation apparatus 1600 under the conditions shown in FIG. 2.

FIG. 21 shows C-T characteristics of a BST film formed under the conditions shown in FIG. 2 by using thin film formation apparatus 1600.

The capacitance changes with temperature to reach 10%/K at the maximum.

[Fifth Embodiment]

By means of thin film formation apparatus 1000 shown in FIG. 1, before deposition of a ferroelectric film, an inorganic film (e.g. SOG (spin-on-glass) film) may be formed on a substrate by applying an organic metal film onto the substrate and annealing it in an oxidizing gas ambient under the following conditions.

Figure 22:
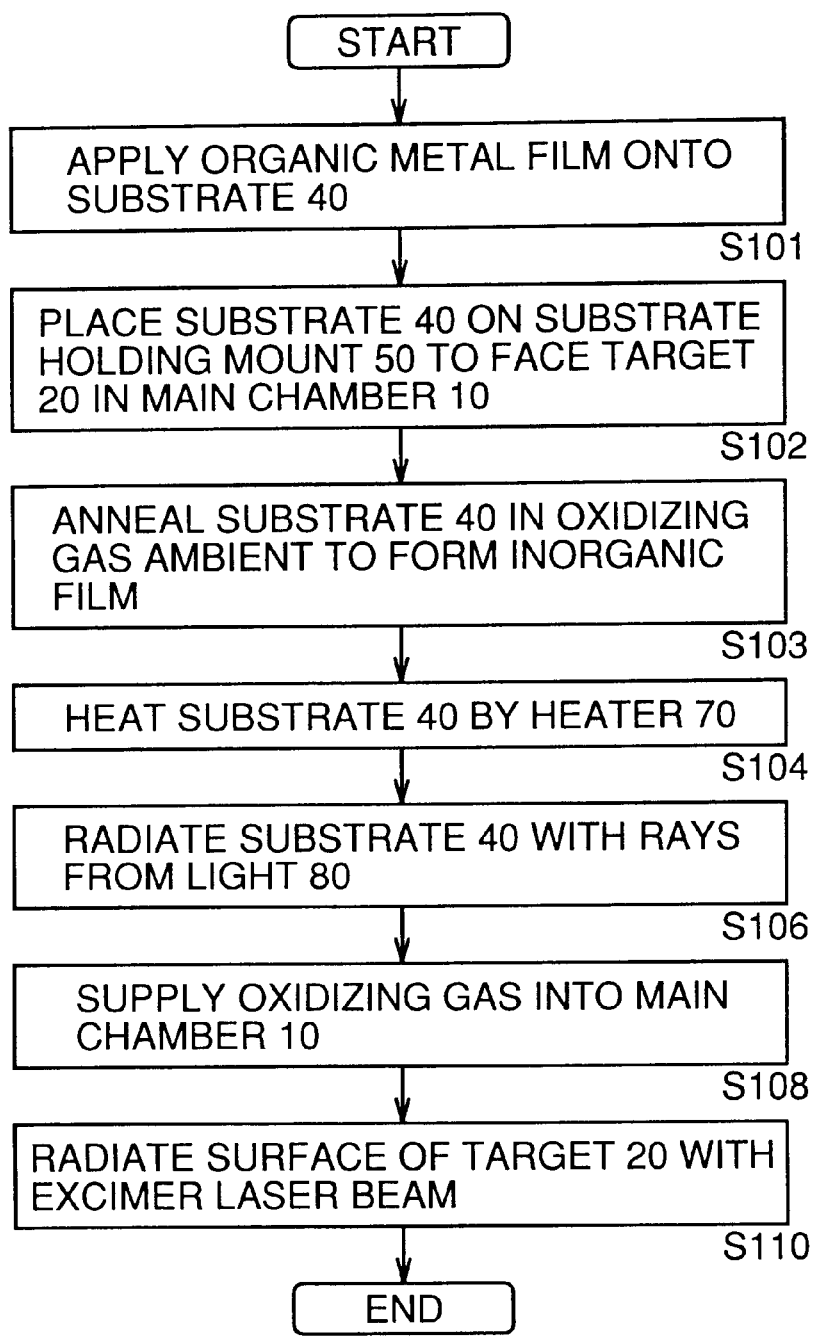
FIG. 22 is a flowchart showing a deposition process according to a fifth embodiment.

FIG. 22 is a flowchart showing a deposition process of a fifth embodiment.

An organic metal film is applied onto a substrate 40 (step S101), substrate 40 is set in a preparation chamber (not shown) and then moved into a main chamber 10 with its air discharged in advance by a molecular pump to a background pressure to a high degree of vacuum (step S102).

An oxidizing gas is supplied into main chamber 10 to anneal substrate 40. The inorganic film is deposited under the conditions of the organic metal film coating at 300 rpm and pre-baking at 150° C. for 30 minutes. Under these conditions, an inorganic film coating is generated to approximately 0.1 μm (step S103). Subsequent film deposition process steps are similar to those of the first embodiment and description thereof is not repeated.

The inorganic film can thus be formed in advance to generate a preferable film as crystal.

Figure 23:
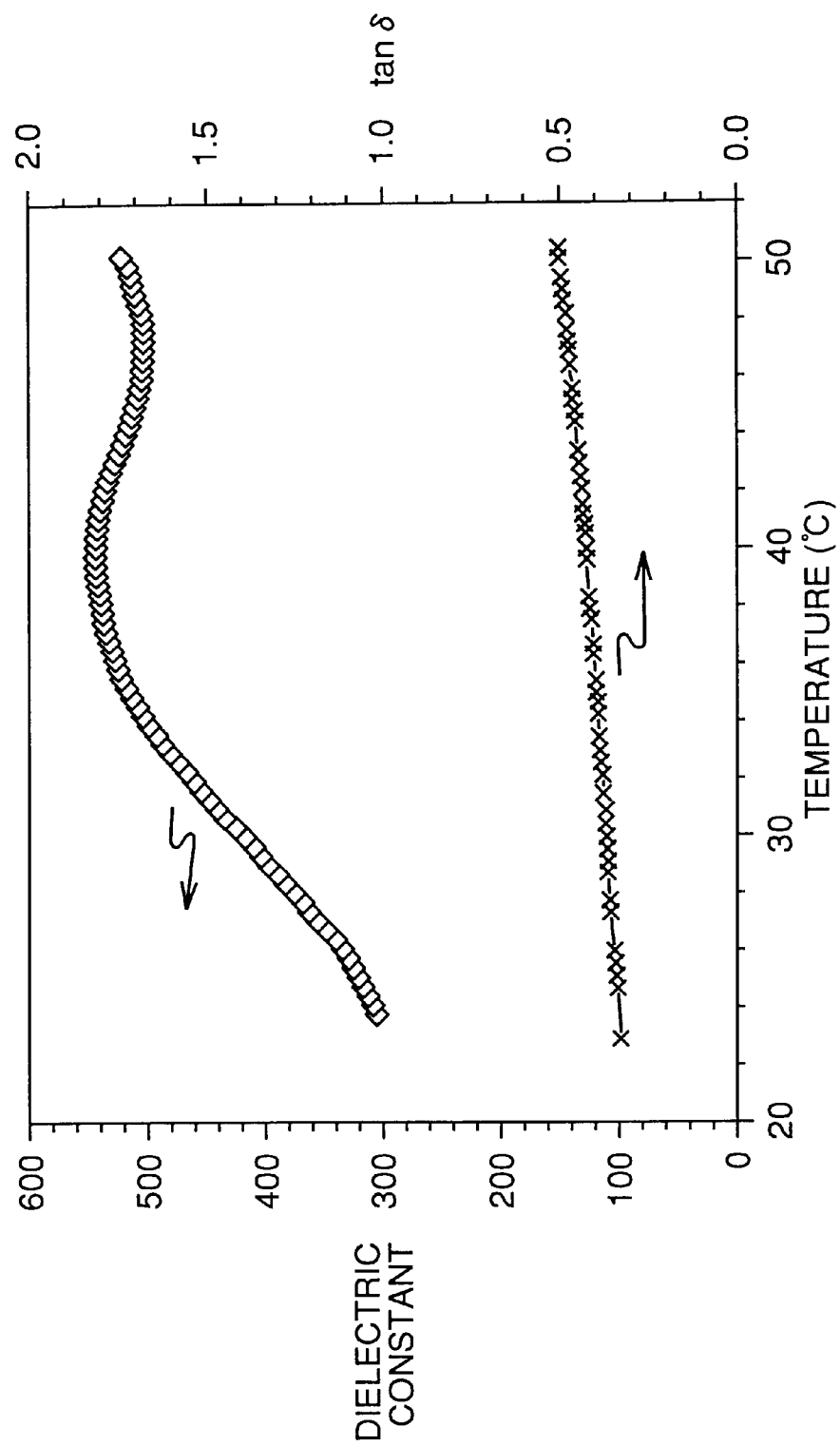
FIG. 23 shows change of dielectric characteristics of a BST film relative to temperature according to the fifth embodiment.

FIG. 23 shows change of dielectric characteristics of a resultant BST film with respect to temperature.

It is seen that the film can be deposited with a sufficiently great change of dielectric constant with temperature and a sufficiently small dielectric loss.

[Sixth Embodiment]

By means of thin film formation apparatus 1400 of the third embodiment shown in FIG. 15, prior to deposition of a ferroelectric film, an inorganic film may be formed on a substrate by applying an organic metal film onto the substrate and annealing it in an oxidizing gas ambient under the following conditions.

Figure 24:
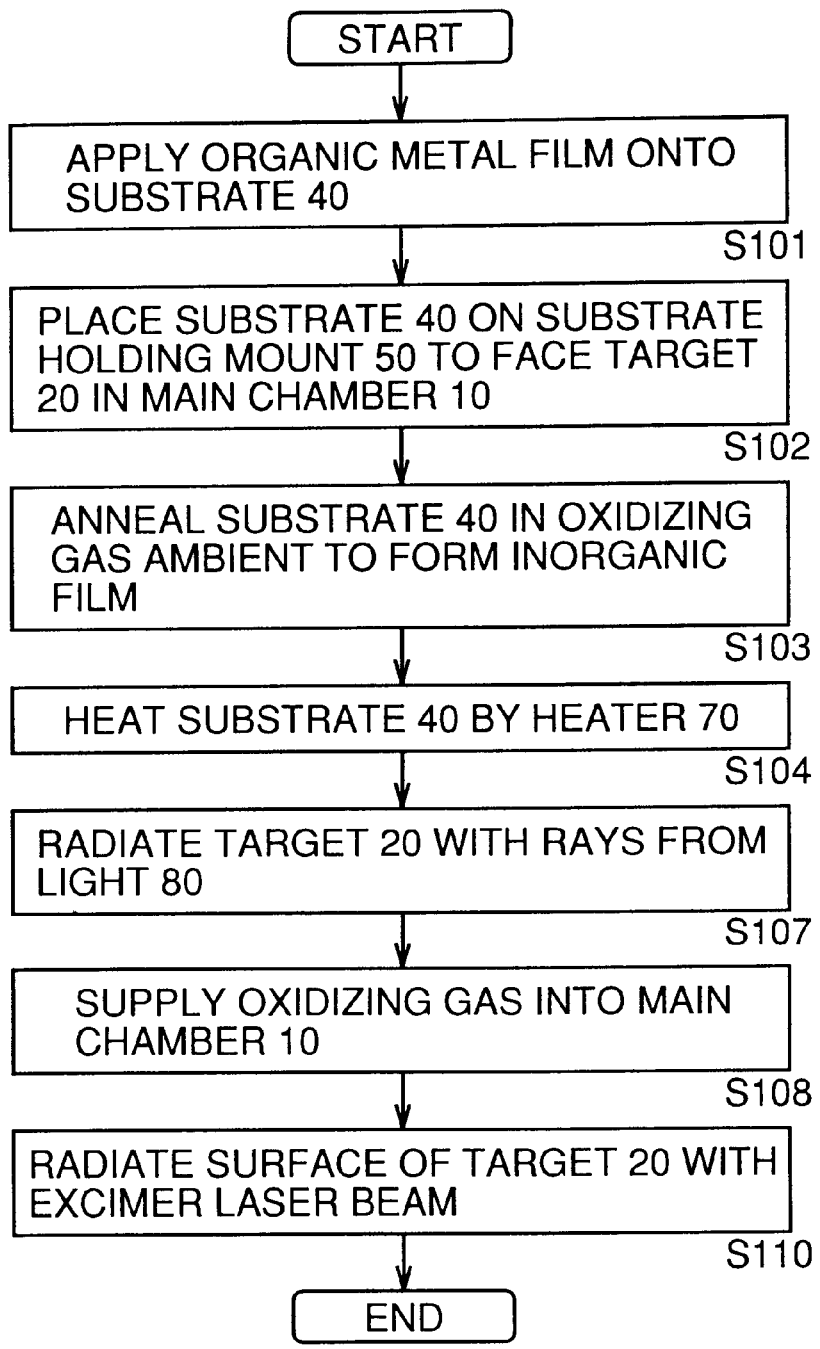
FIG. 24 is a flowchart showing a deposition process according to a sixth embodiment.

FIG. 24 is a flowchart showing a deposition process of a sixth embodiment. The process of the sixth embodiment is different from that shown in FIG. 22 of the fifth embodiment in that substrate 40 is radiated with light rays by light 80 in step S106 of the fifth embodiment while a target 20 is radiated with light rays by a light 80 in step S107 of the sixth embodiment. Other details are similar to those of the fifth embodiment shown in FIG. 22 and therefore description thereof is not repeated.

The inorganic film is deposited under the conditions of the coating at 300 rpm and pre-baking at 150° C. for 30 minutes. Under these conditions, an inorganic film coating is generated to approximately 0.1 μm. The inorganic film can thus be formed in advance to generate a preferable film as crystal.

Figure 25:
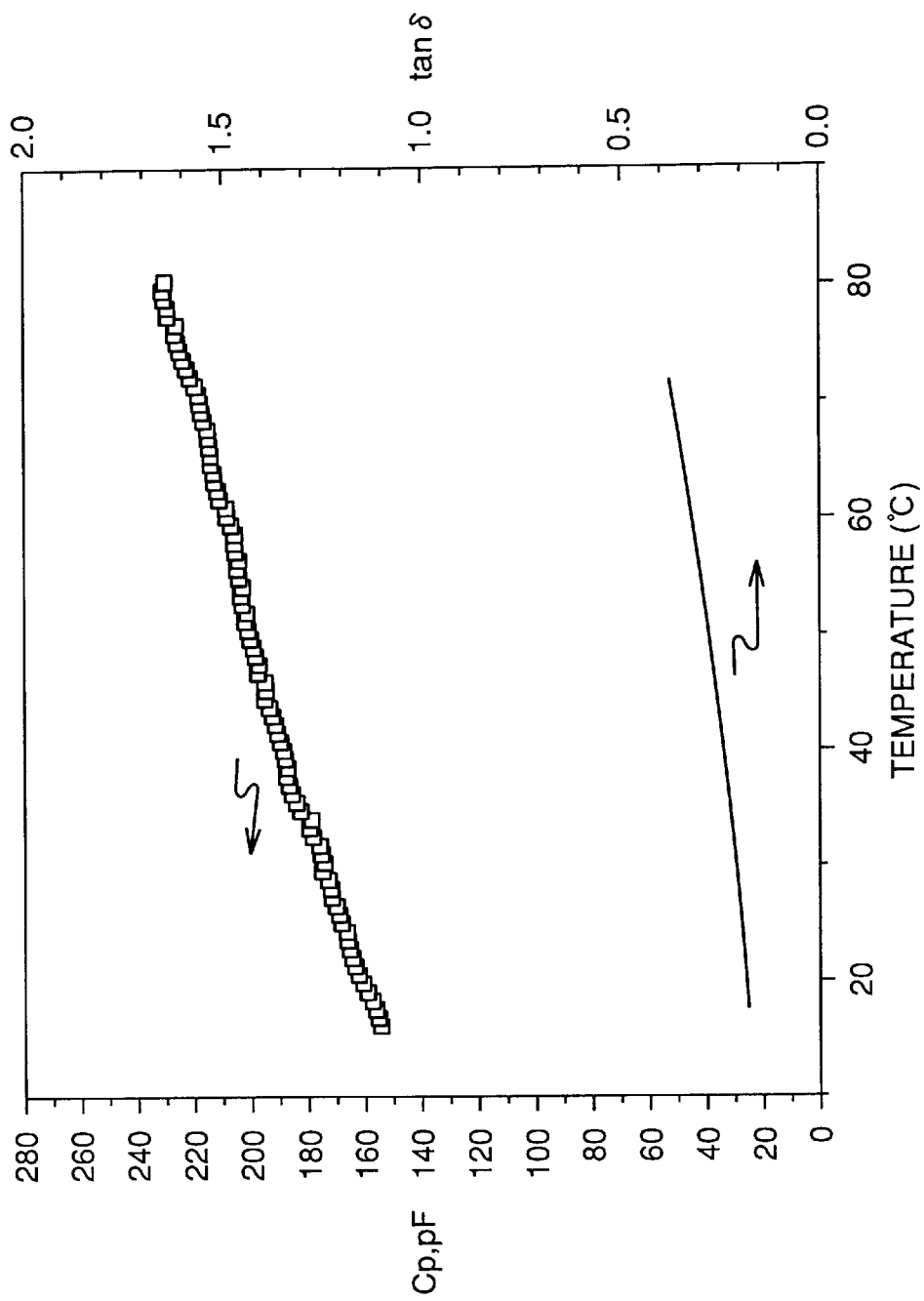
FIG. 25 shows change of dielectric characteristics of a BST film relative to temperature according to the sixth embodiment.
Figure 26:
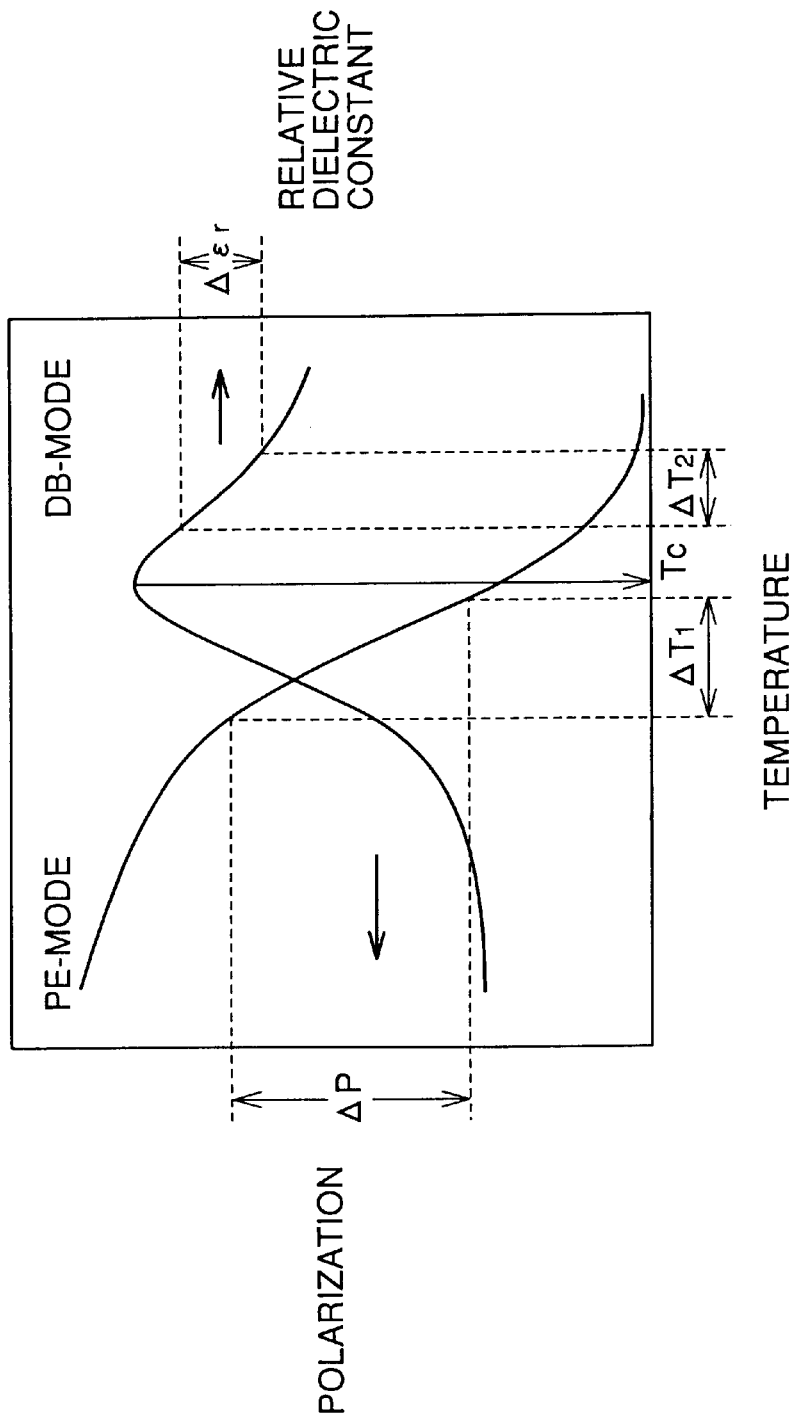
FIG. 26 shows respective temperature dependencies of polarization and dielectric constant.

FIG. 25 shows change of dielectric characteristics of a resultant BST film with respect to temperature.

It is seen that the film can be deposited with a sufficiently great change of dielectric constant with temperature and a sufficiently small dielectric loss.

As heretofore discussed, the thin film formation apparatus according to the present invention is used to form a ferroelectric thin film to be applied to an infrared detecting element. Consequently, an infrared image sensor of small size capable of operating at room temperature is achieved and thus a thermography can be obtained with a simple structure.

Applications over a wide range are thus possible including not only indoor uses like early diagnosis of diseases, fault diagnosis of machines and instruments, and gas leakage detection but also outdoor uses like city and natural environment monitoring, fire watching, driving assistant in a dark field for automobile, nondestructive diagnosis of buildings, intrusion alarm, resource exploration, weather observation, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film formation apparatus comprising:

a vacuum chamber;

a target unit provided at a predetermined position in said vacuum chamber that can fix a target containing a film material;

a high energy radiation source for emitting high energy radiation to a surface of said target fixed to said target unit;

an optical device for concentrating said high energy radiation to said target fixed to said target unit;

a substrate holding unit provided to face said target unit and hold a substrate for depositing thereon a substance ejected from said target by said high energy radiation;

an oxidizing gas inlet unit for supplying an oxidizing gas into said vacuum chamber so as to oxidize said substance deposited on said substrate;

a heating unit for heating said substrate in said vacuum chamber; and a first irradiation unit for irradiating with activation light rays said substrate held by said substrate holding unit.

2. The thin film formation apparatus according to claim 1, wherein said target unit includes rotating means for fixing a cylindrical target and rotating said cylindrical target on the central axis of said cylindrical target, and said substrate holding unit includes moving means for moving said substrate in parallel with the central axis of said cylindrical target.

3. A thin film formation apparatus comprising:

a vacuum chamber;

a target unit provided at a predetermined position in said vacuum chamber that can fix a target containing a film material;

a high energy radiation source for emitting high energy radiation to a surface of said target fixed to said target unit;

an optical device for concentrating said high energy radiation to said target fixed to said target unit;

a substrate holding unit provided to face said target unit and hold a substrate for depositing thereon a substance ejected from said target by said high energy radiation;

an oxidizing gas inlet unit for supplying an oxidizing gas into said vacuum chamber so as to oxidize said substance deposited on said substrate;

a heating unit for heating said substrate in said vacuum chamber; and a first irradiation unit for irradiating with activation light rays said target fixed to said target unit.

4. The thin film formation apparatus according to claim 3, wherein said target unit includes rotating means for fixing a cylindrical target and rotating said cylindrical target on the central axis of said cylindrical target, and said substrate holding unit includes moving means for moving said substrate in parallel with the central axis of said cylindrical target.

* * * * *

UNITED STATES PATENT AND TRADEMARK OFFICE
CERTIFICATE OF CORRECTION

PATENT NO. : 6,576,566 B2
DATED : June 10, 2003
INVENTOR(S) : Hashimoto et al.

It is certified that error appears in the above-identified patent and that said Letters Patent is hereby corrected as shown below:

<u>Title page,</u>
Item [75], change the address from "Masanori Okuyama 16-13, Uneosaka Toyonaka-shi, Osaka (JP)" to -- Masanori Okuyama, Osaka (JP) --
Item [73], change the assignee "Matshushita Electric Industrial Co.," to
-- [73]  Assignee:  Matsushita Electric Industrial Co., --

Signed and Sealed this

Twentieth Day of January, 2004

JON W. DUDAS
*Acting Director of the United States Patent and Trademark Office*